(12) United States Patent
Manger et al.

(10) Patent No.: US 7,662,721 B2
(45) Date of Patent: Feb. 16, 2010

(54) HARD MASK LAYER STACK AND A METHOD OF PATTERNING

(75) Inventors: Dirk Manger, Dresden (DE); Hocine Boubekeur, Dresden (DE); Martin Verhoeven, Radebeul (DE); Nicolas Nagel, Dresden (DE); Thomas Tatry, Dresden (DE); Dirk Caspary, Dresden (DE); Matthias Markert, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 403 days.

(21) Appl. No.: 11/376,645

(22) Filed: Mar. 15, 2006

(65) Prior Publication Data
US 2007/0215986 A1   Sep. 20, 2007

(51) Int. Cl.
*H01L 21/461* (2006.01)
(52) U.S. Cl. .................. 438/717; 438/736; 257/E21.035
(58) Field of Classification Search .................. 438/736, 438/671, 717; 257/E21.035, E21.039
See application file for complete search history.

(56) References Cited

U.S. PATENT DOCUMENTS

| 6,168,904 | B1 | | 1/2001 | Cuthbert et al. |
| 7,071,085 | B1 | * | 7/2006 | Lukanc et al. ............... 438/671 |
| 7,109,101 | B1 | * | 9/2006 | Wright et al. ......... 257/E21.035 |
| 7,115,525 | B2 | * | 10/2006 | Abatchev et al. ...... 257/E21.035 |
| 7,151,040 | B2 | * | 12/2006 | Tran et al. .................... 438/709 |
| 7,223,525 | B2 | | 5/2007 | Lipinski |
| 7,253,118 | B2 | * | 8/2007 | Tran et al. ............. 257/E21.039 |
| 7,390,746 | B2 | * | 6/2008 | Bai et al. .............. 257/E21.039 |
| 2006/0077702 | A1 | | 4/2006 | Sugimae et al. |

FOREIGN PATENT DOCUMENTS

| DE | 10349764 | 6/2005 |
| WO | 2005076337 | 8/2005 |
| WO | 2006101695 | 9/2006 |

* cited by examiner

*Primary Examiner*—W. David Coleman
*Assistant Examiner*—Sun M Kim
(74) *Attorney, Agent, or Firm*—Dicke, Billig & Czaja, PLLC

(57) ABSTRACT

A hard mask layer stack for patterning a layer to be patterned includes a carbon layer disposed on top of the layer to be patterned, a first layer of a material selected from the group of $SiO_2$ and SiON disposed on top of the carbon layer and a silicon layer disposed on top of the first layer. A method of patterning a layer to be patterned includes providing the above described hard mask layer stack on the layer to be patterned and patterning the silicon hard mask layer in accordance with a pattern to be formed in the layer that has to be patterned.

4 Claims, 27 Drawing Sheets

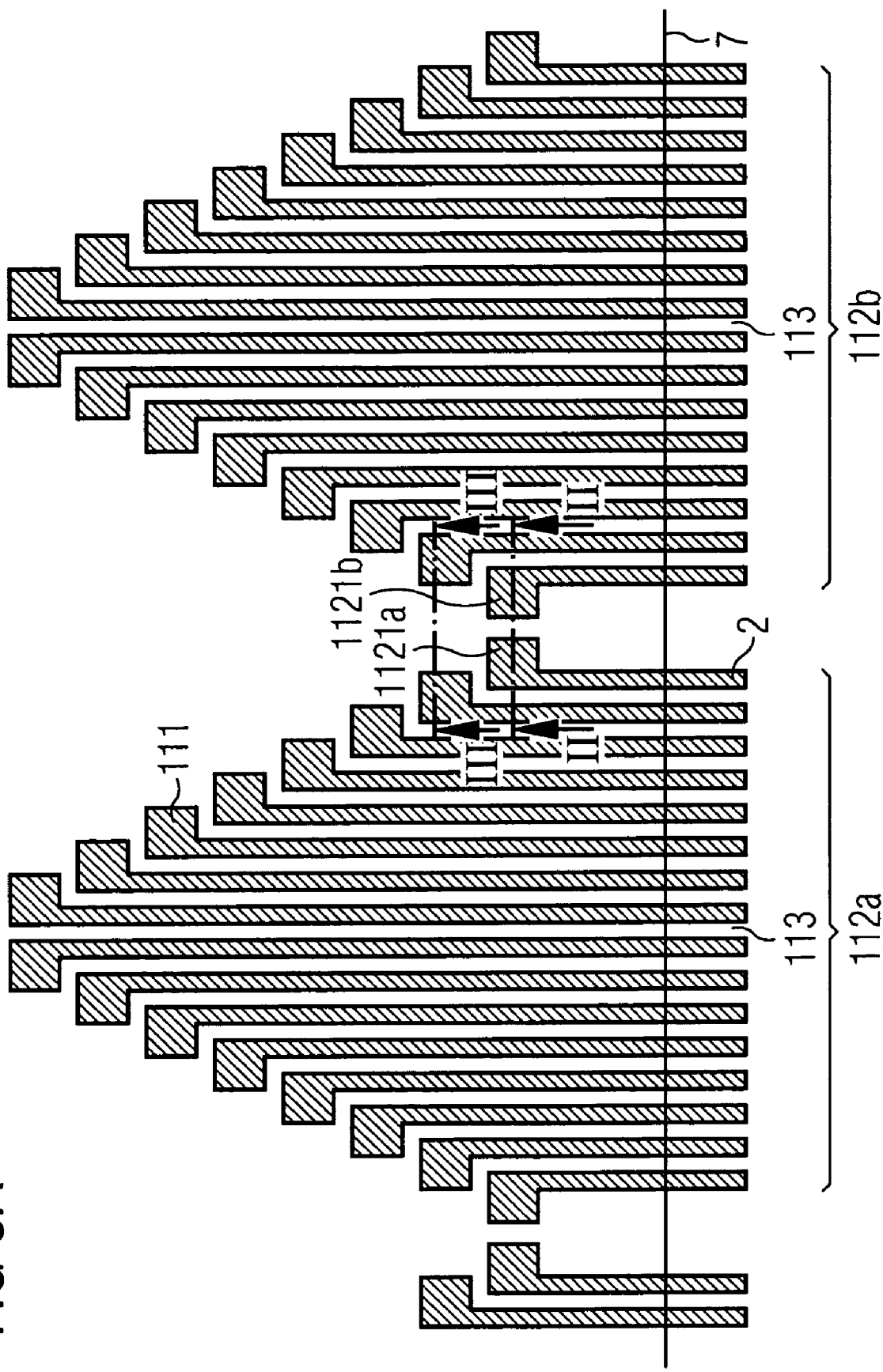

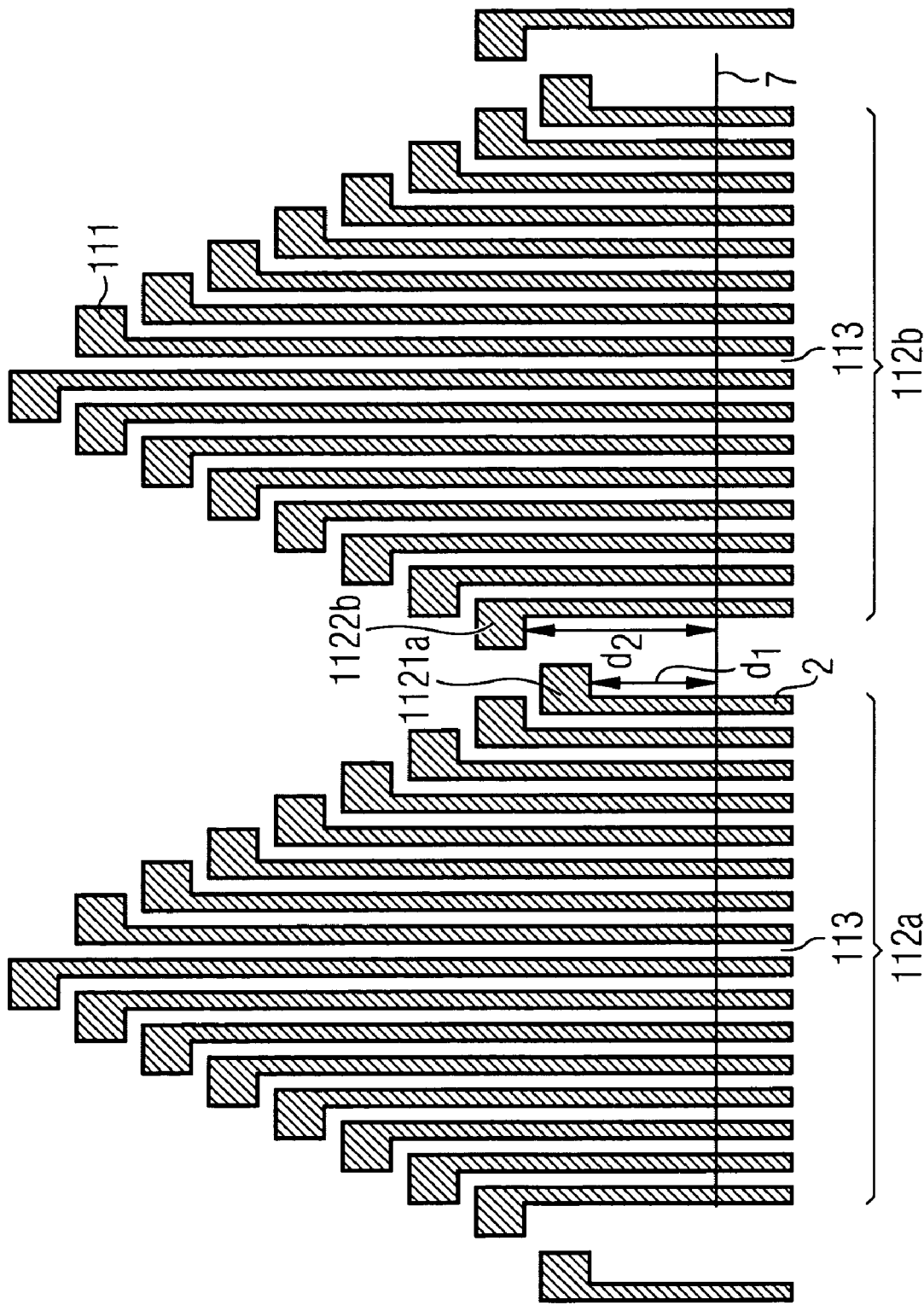

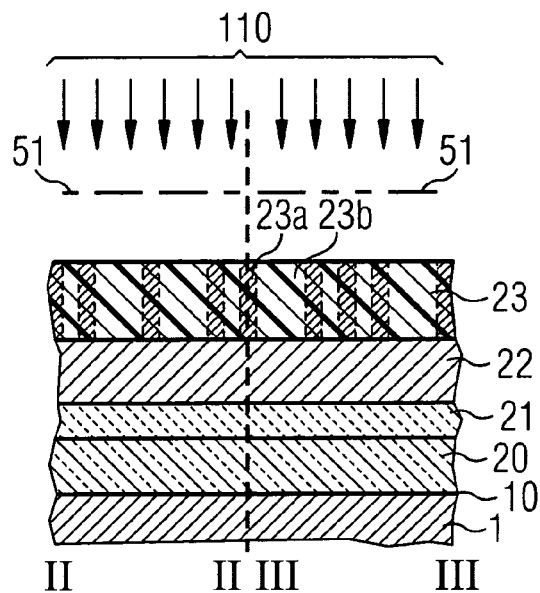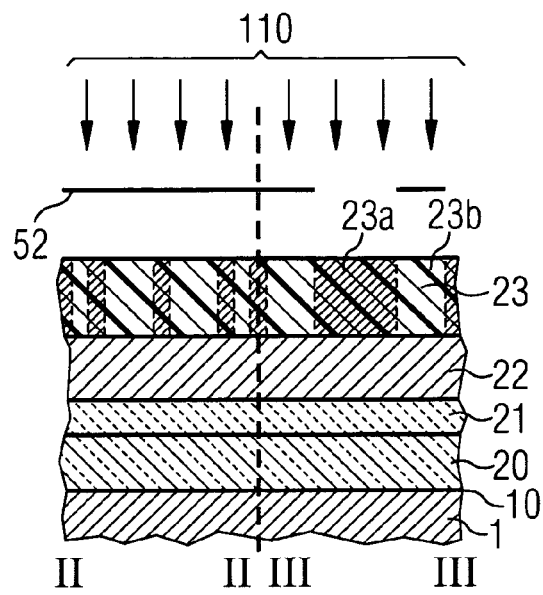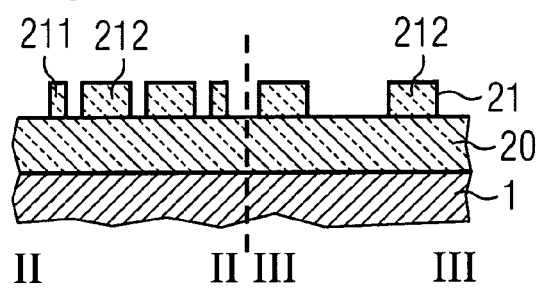

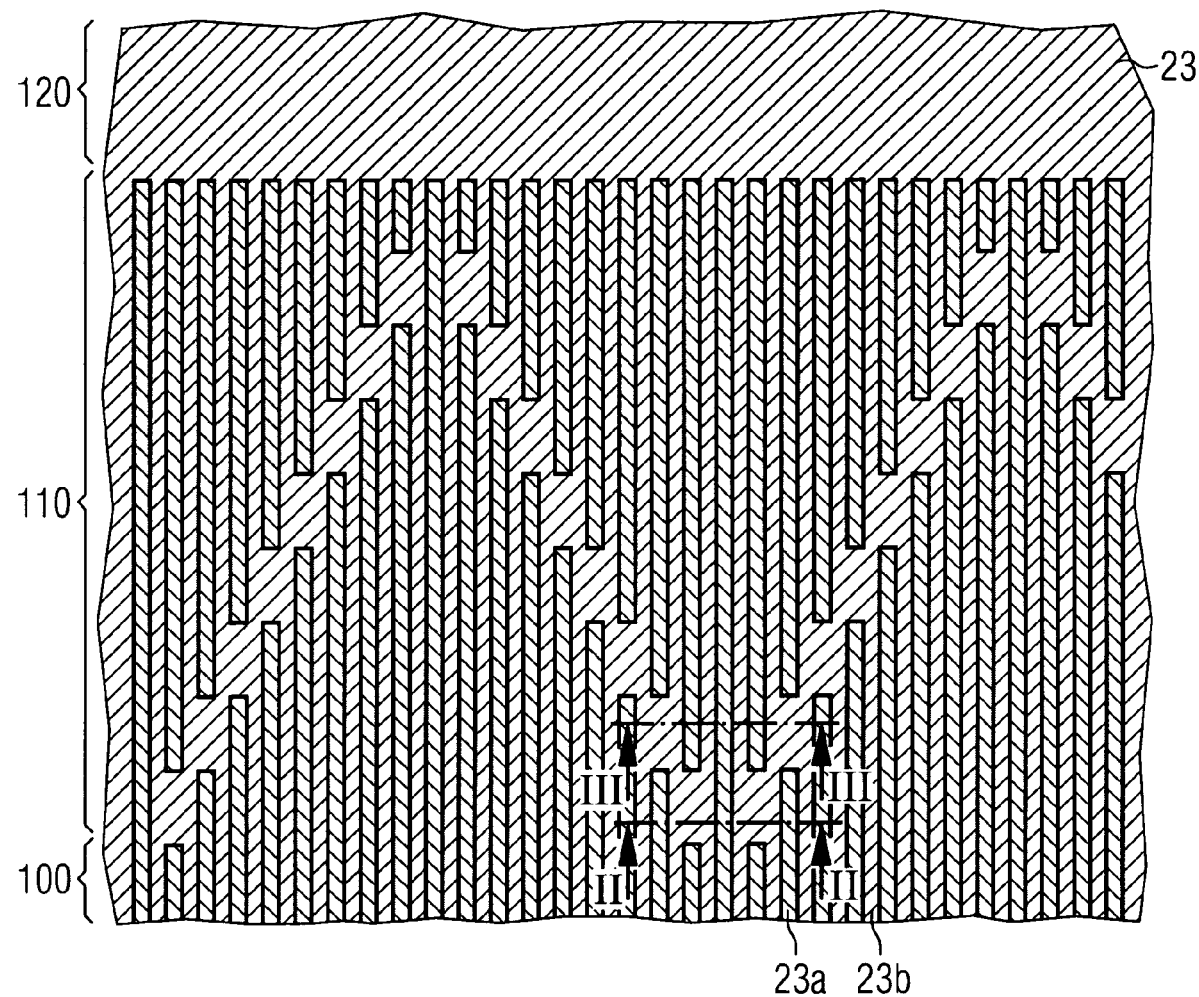

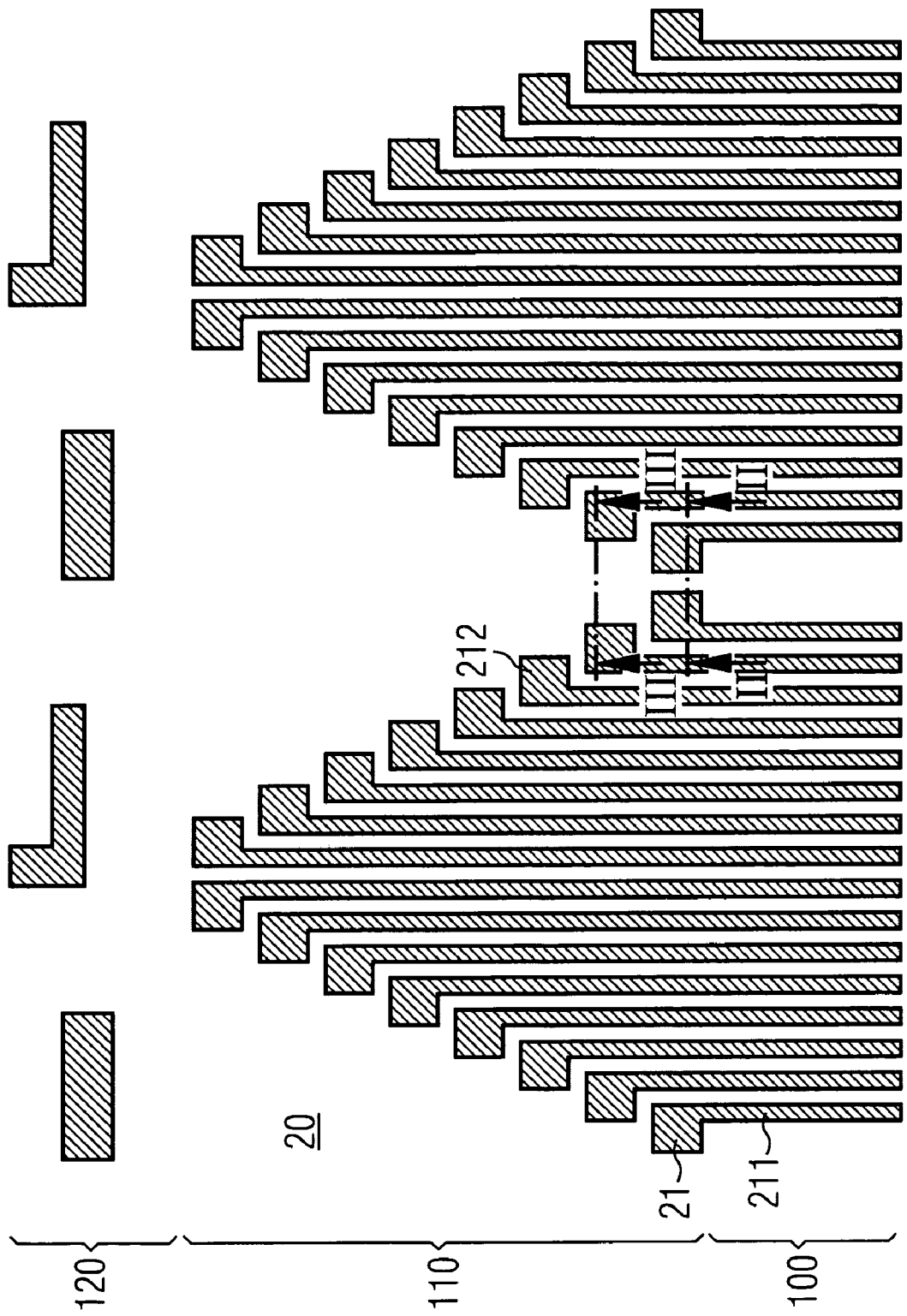

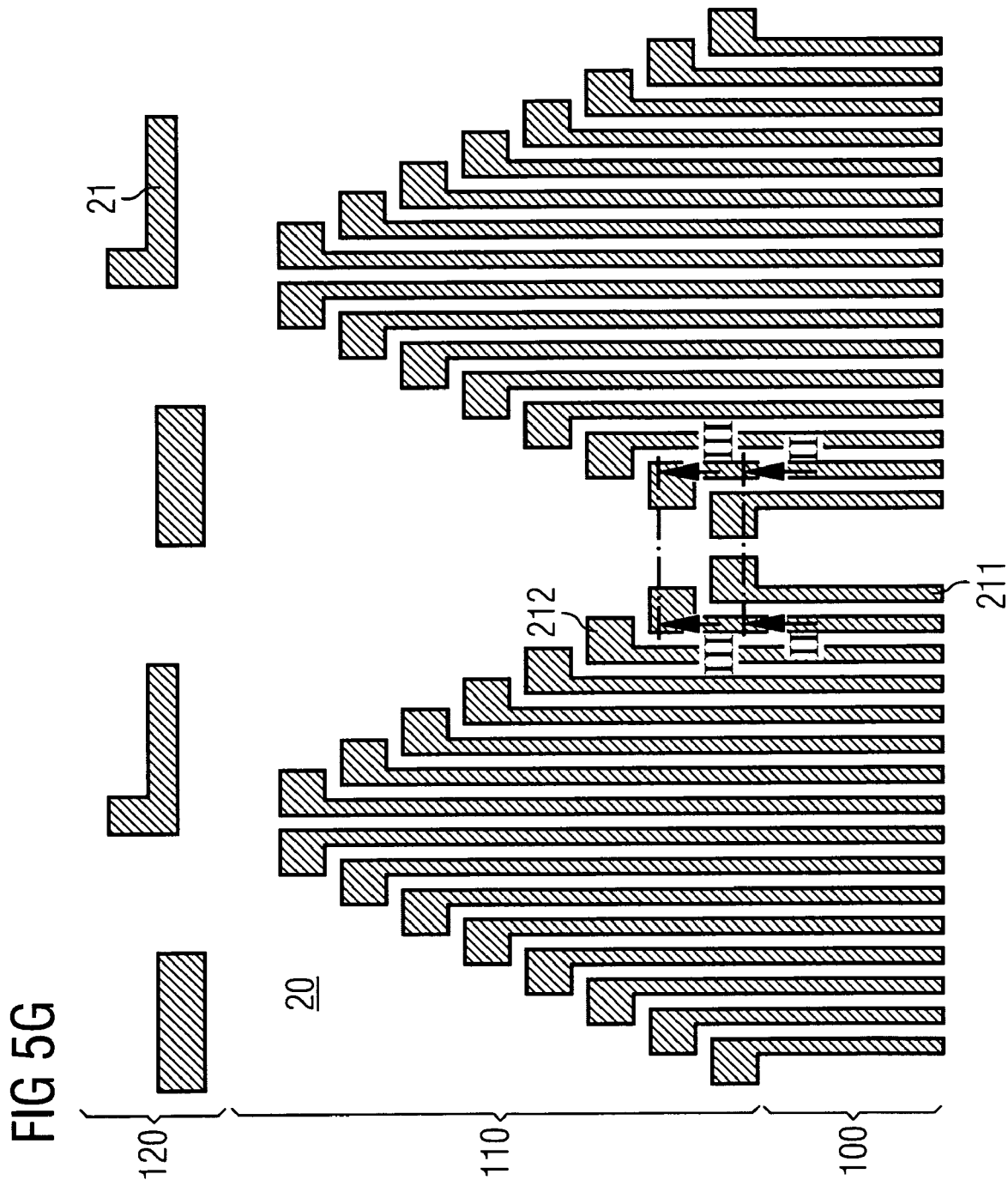

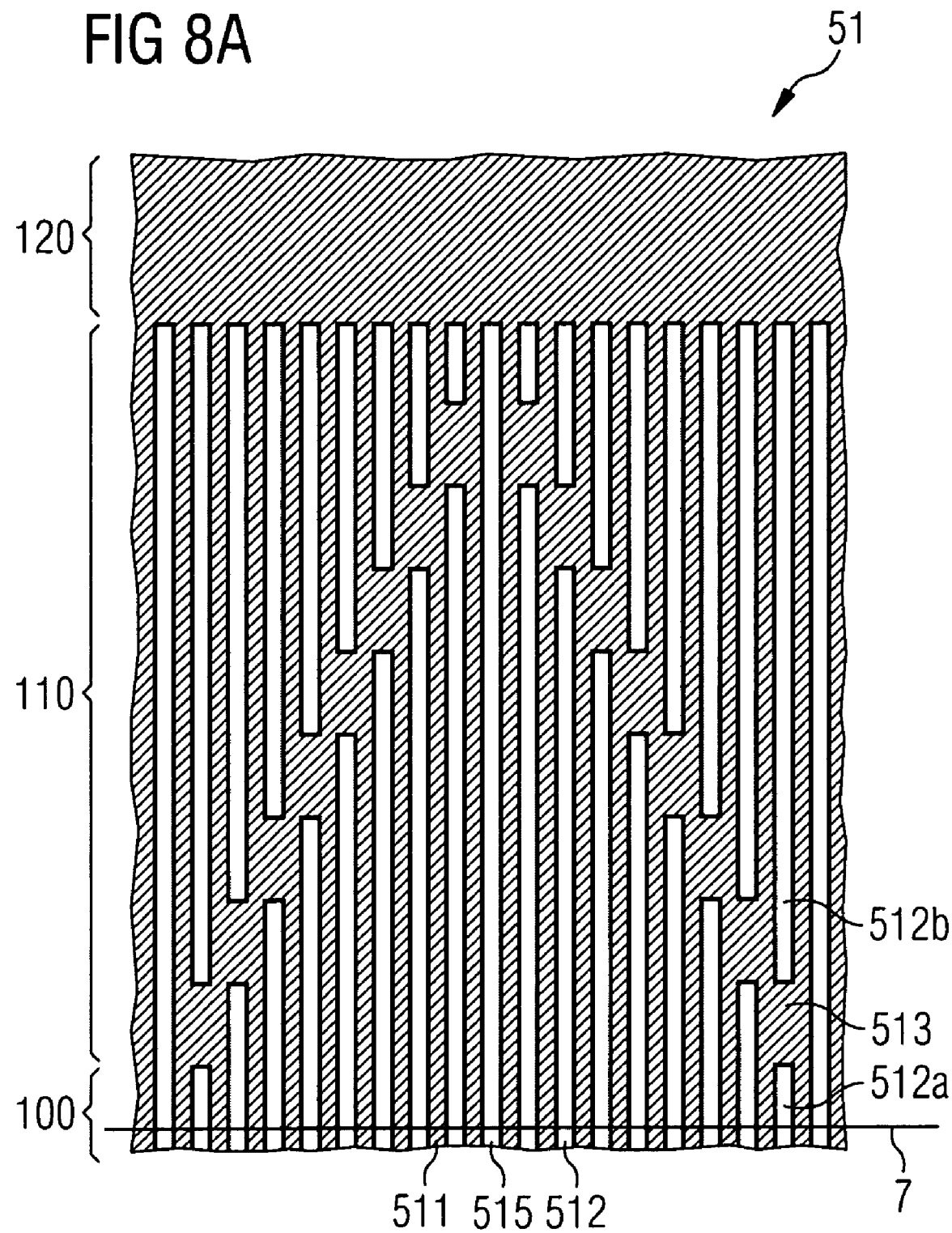

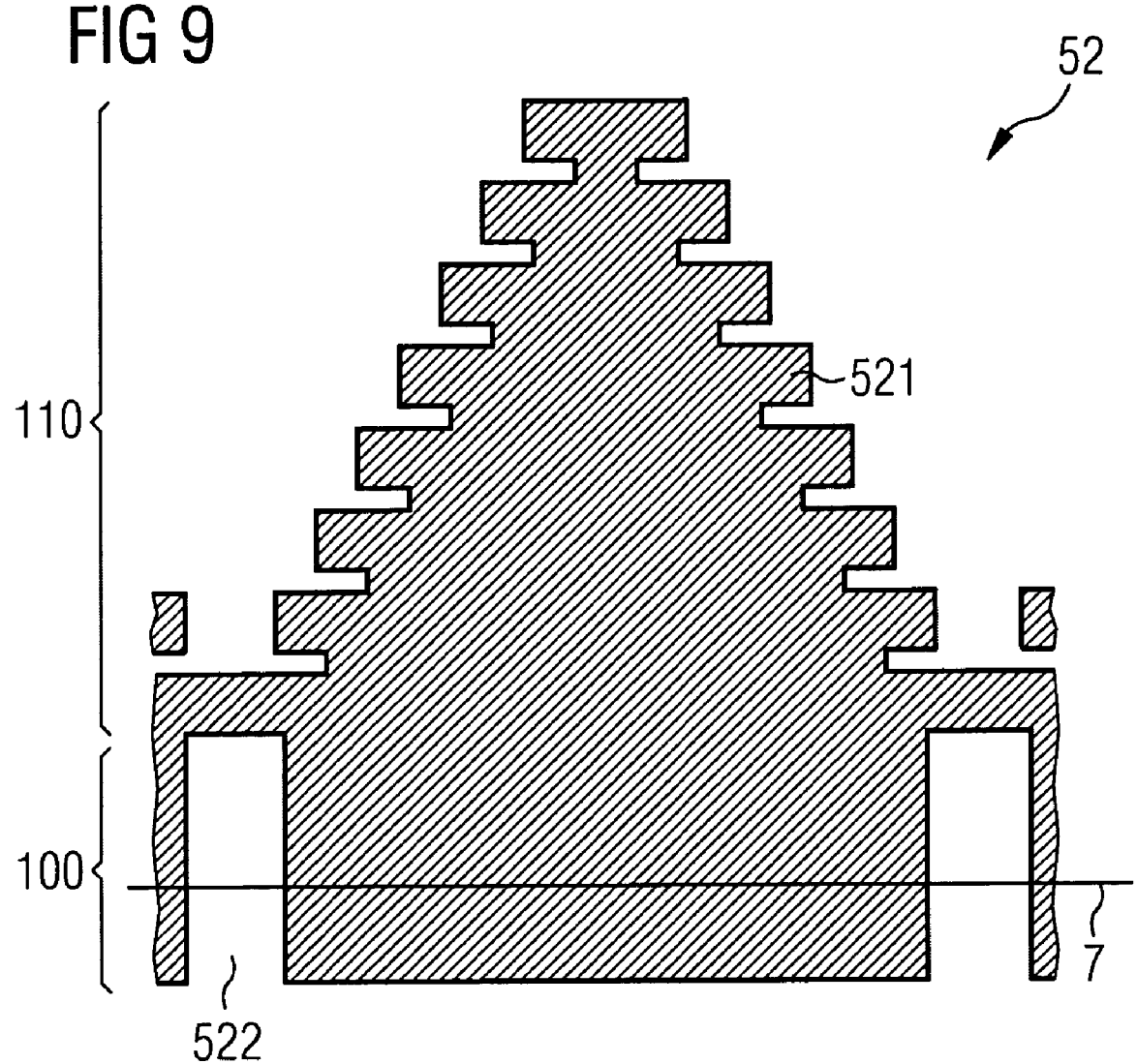

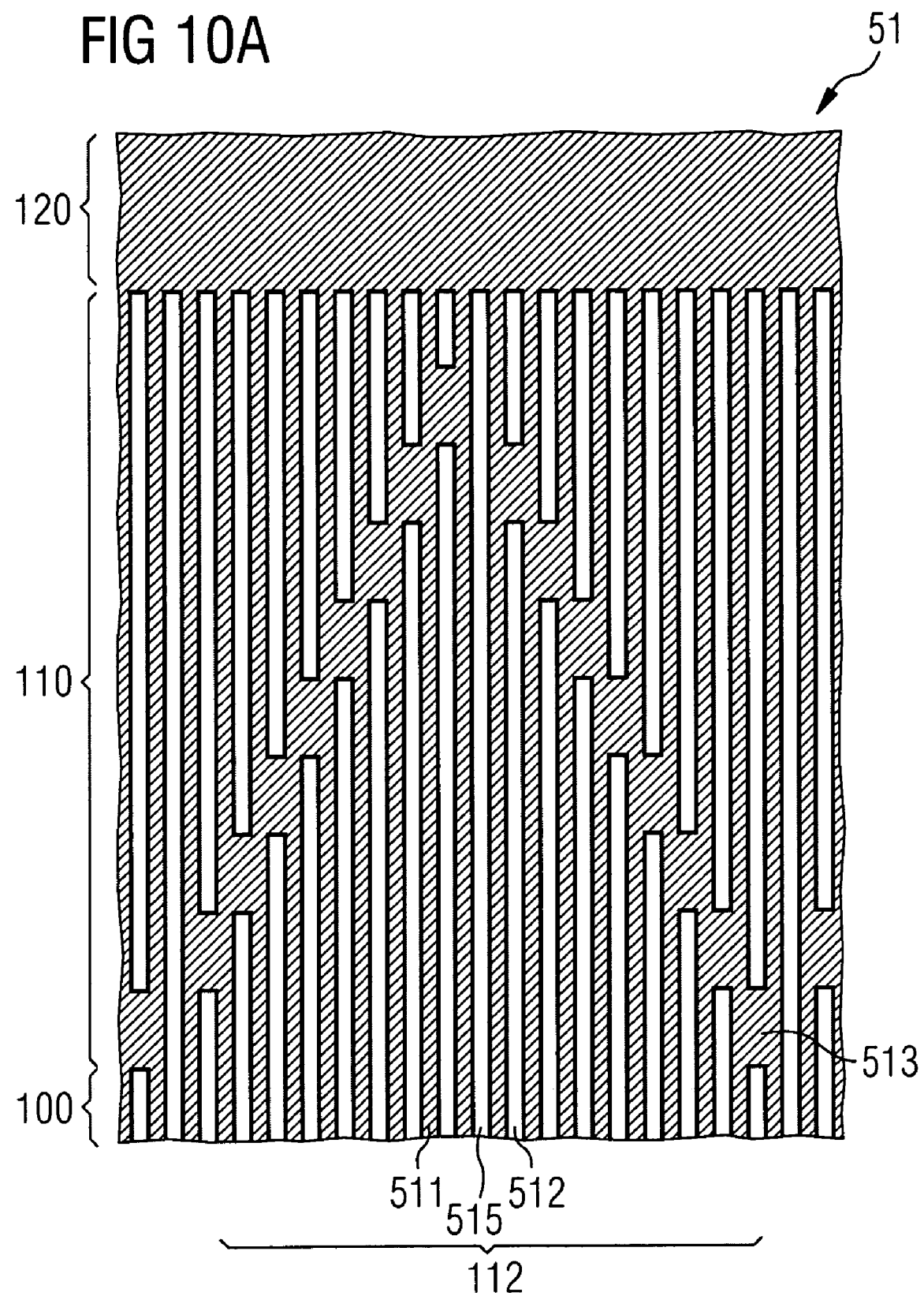

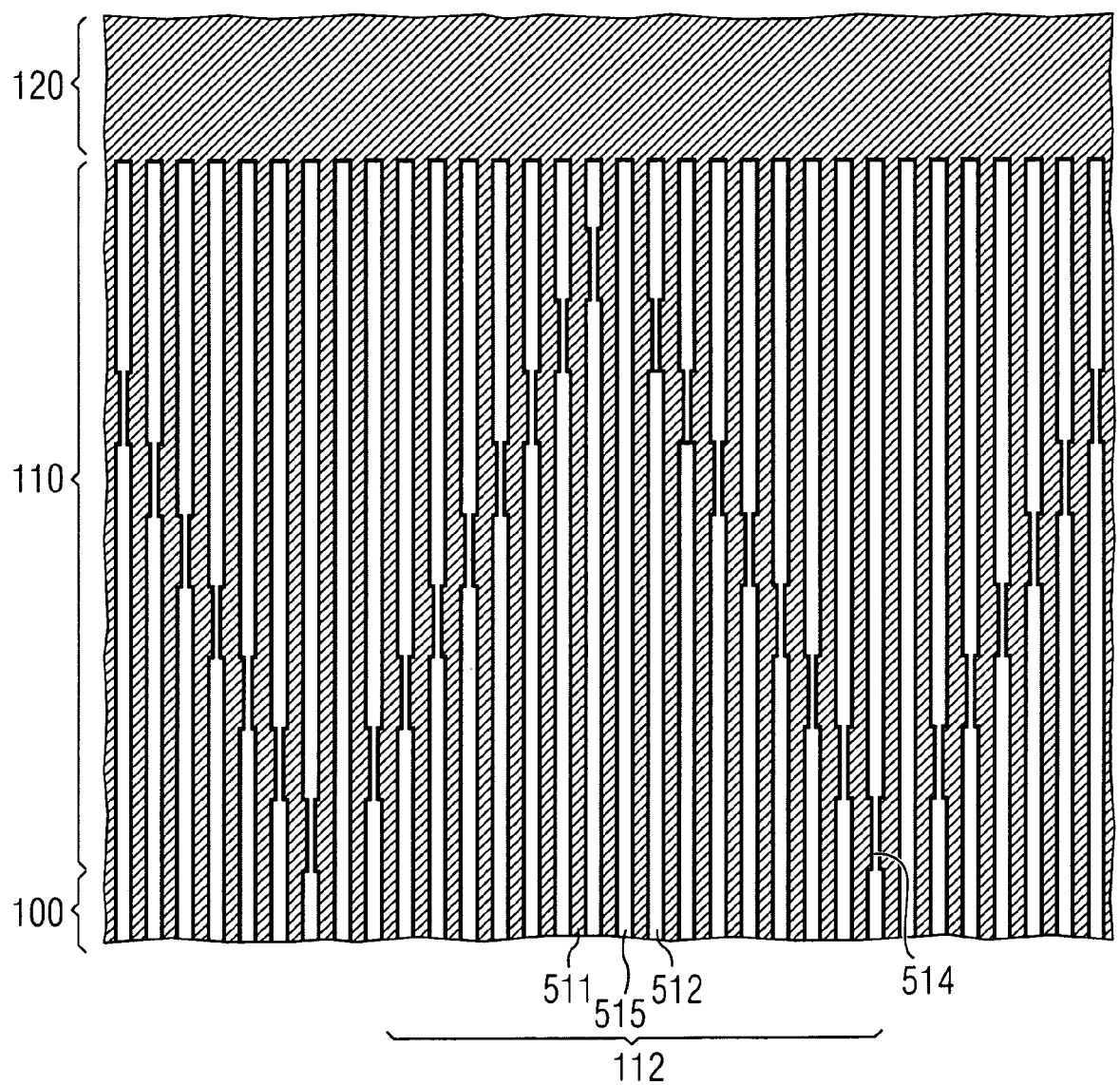

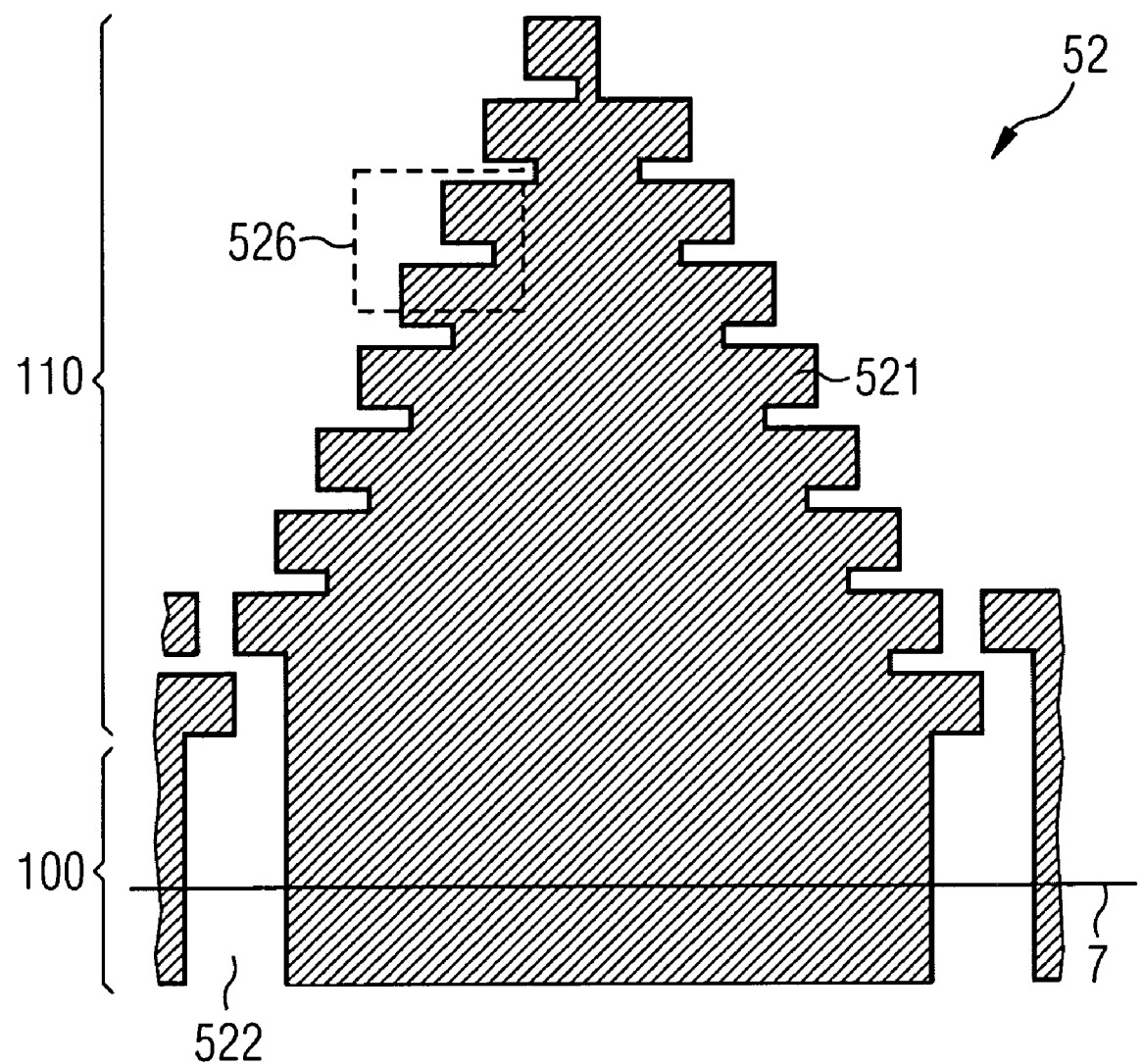

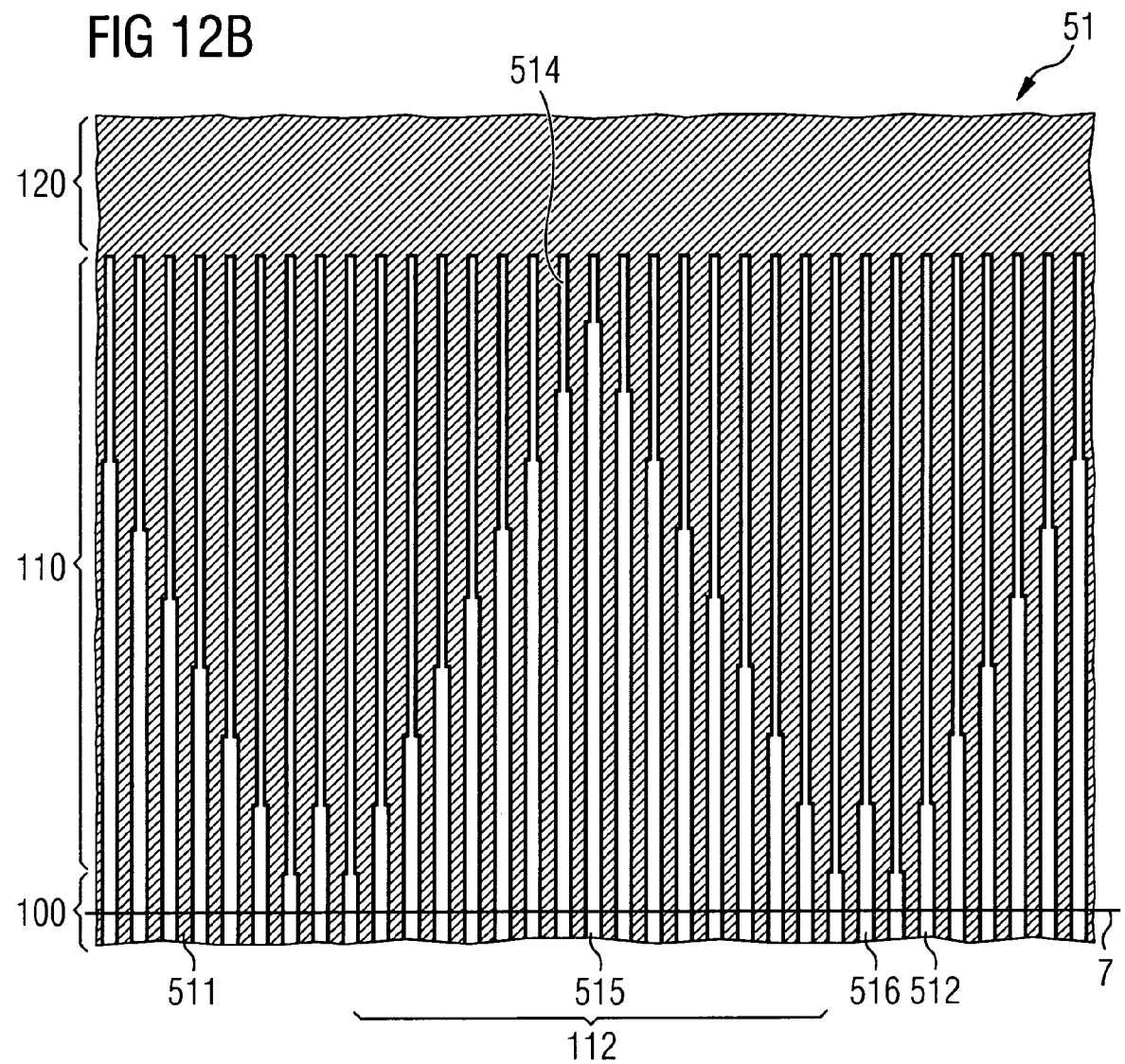

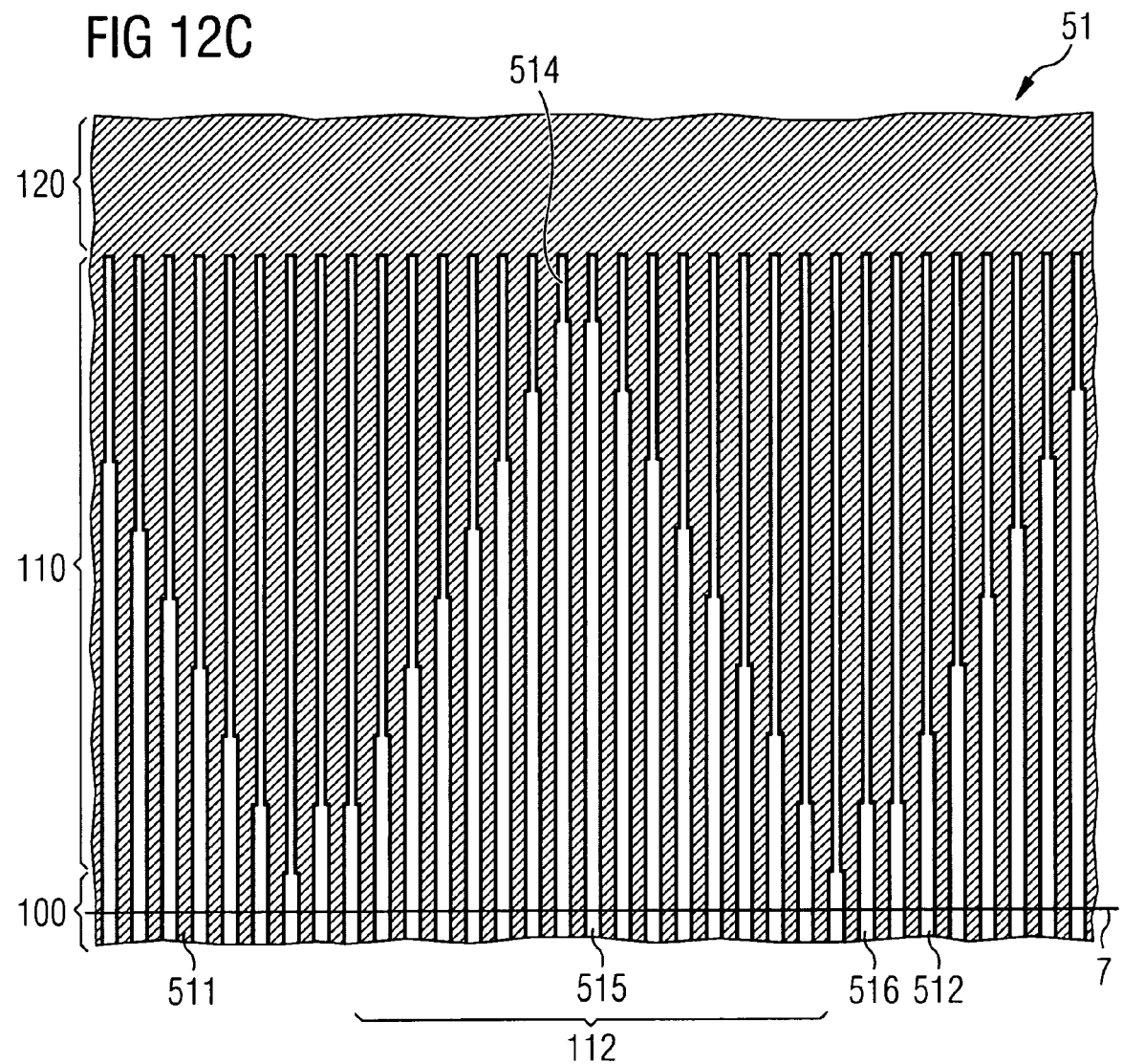

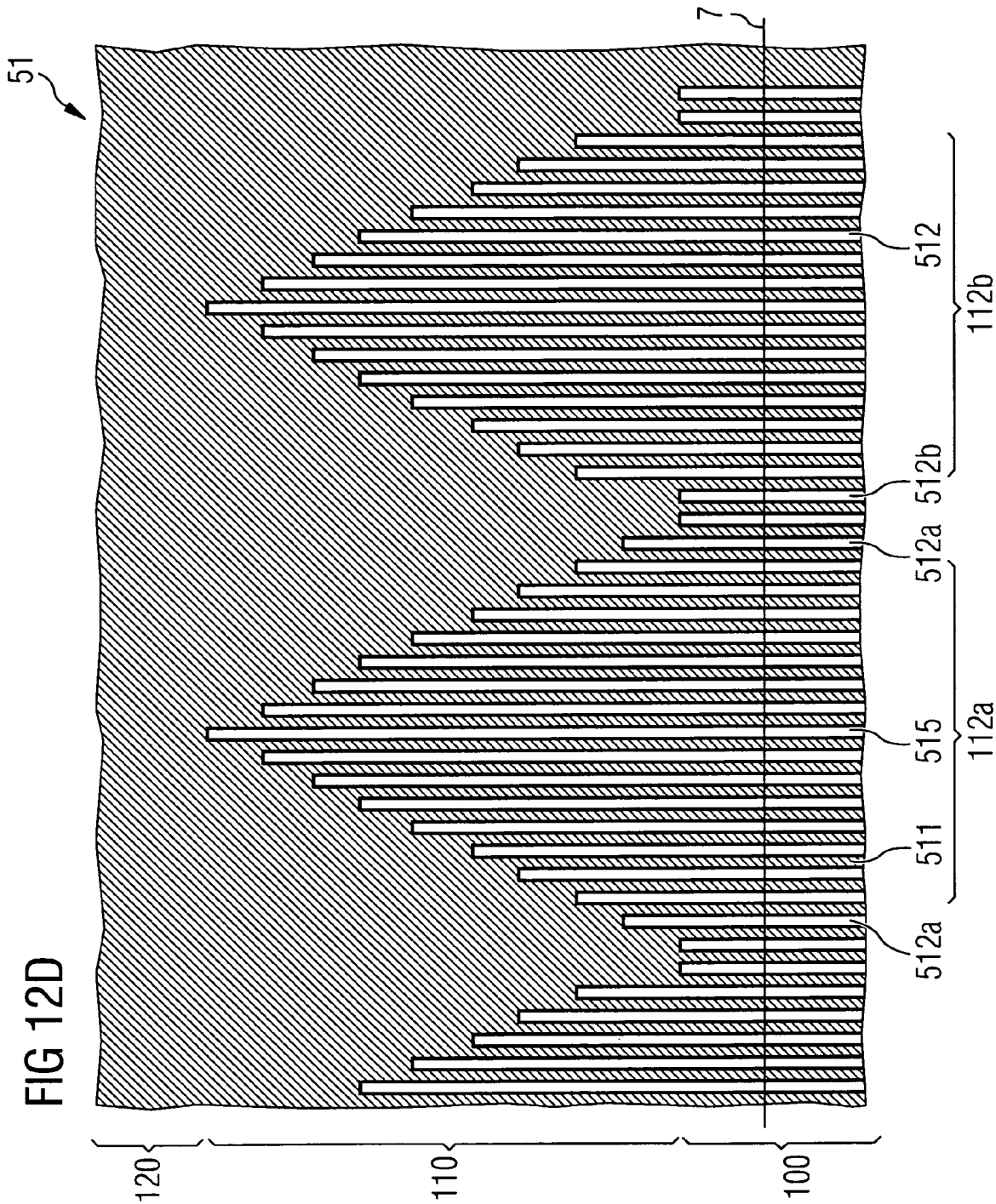

HARD MASK LAYER STACK AND A METHOD OF PATTERNING

BACKGROUND

One embodiment of the invention relates to a novel hard mask layer stack. In addition, one embodiment of the invention relates to a method of patterning a layer using this hard mask layer stack. Furthermore, one embodiment of the invention relates to a memory device, a method of forming a memory device and to masks used by this method.

Semiconductor devices include arrays of conductive lines in several layers of the device. The conductive lines of such arrays usually are arranged in parallel and are electrically insulated from one another laterally by a dielectric material. The lateral distance between two conductive lines and the width of a conductive line sum to the pitch of the array of lines. The pitch is the dimension of the periodicity of a periodic pattern arrangement. The lines succeed one another in a completely periodic fashion, in order to reduce the necessary device area as much as possible.

By way of example, semiconductor memory devices include arrays of conductive lines which connect specific parts of memory cells arranged in rows and columns and which thus address the memory cells. Nevertheless, it is not necessary to address each memory cell separately. Usually, two sets of conductive lines are formed where the first set runs along a first direction and is called word lines and where the second set runs along a second direction intersecting the first direction and is called bit lines. Usually word or bit lines are formed by patterning a conductive layer stack so as to form single lines which are arranged in parallel.

Nevertheless, a semiconductor device may include arrays of conductive lines in other layers than the word or bit line layer.

FIG. 1A illustrates a plan view of an exemplary memory device comprising an array 100 of memory cells. To be more specific, the memory cell array 100 includes word lines 2 extending in a first direction as well as bit lines extending in a second direction. Memory cells 45 are disposed between adjacent bit lines at each point of intersection of a substrate portion with a corresponding word line 2. At a point of intersection of the word lines and bit lines, the bit lines and the word lines are insulated from each other by a thick silicon dioxide layer (not shown). In order to minimize the area for the memory cell array 100, the pitch of the array of the word lines is reduced as much as possible. Nevertheless, for contacting the single word lines landing pads 111 having a minimum area are needed. Usually, these landing pads 111 are disposed in a contact or fanout region 110 adjacent to the memory cell array 100. In order to achieve a contact having an appropriate contact resistance, the area of each of the landing pads 111 must have a minimum value. Furthermore, a minimum value of the landing pads is needed to securely make a contact to upper wiring layers without having challenging overlay specifications.

As is illustrated in FIG. 1A, the word lines 2 have a minimum width wmin and a minimum distance dmin from each other. In order to increase the package density of such a memory cell array, the width and the distance of the word lines could be reduced. However, when shrinking the width of the word lines 2, a minimum contact area in the contact region 110 should be maintained. Differently stated, the difference in size between the width of the word lines 2 and the lateral dimensions of the landing pads 111 becomes greater.

Different problems arise from the shrinking in the width and pitch of the word lines. For example, landing pads 111 which have a relatively large area with respect to the width of the word lines have to be arranged at the end of each word line without contacting or affecting each other. One solution to this is the arrangement of landing pads at both sides of the array, as illustrated in FIG. 1B. Having landing pads of only every second word line at one side of the array, the landing pads can have a large area without contacting or affecting neighbouring landing pads. However, the arrangement of landing pads at both sides of the array results in a complex wiring scheme in upper layers affecting the performance of the memory device. For example, lines have to be generated in another layer that connect every second pad at the other side of the array.

A further problem that arises from the shrinking the pitch of the word lines relates to the patterning of these small structures. If the word line array is patterned by using a photolithography technique that is usually employed, the lateral dimensions of the word lines as well as the distance between neighbouring word lines is limited by the minimal structural feature size which is obtainable by the technology used. However, a lithographic step for simultaneously imaging different ground rules (large area of landing pads and small conductive lines) is very difficult to implement, since the lithographic step and the used mask have to be optimized for imaging the smallest structure. Therefore, further shrinking of word line width and pitch (word line width smaller than 70 nm), and thus further shrinking of memory devices, is difficult using a single exposure lithography.

Although these problems are described herein for word line arrays of memory devices by way of example, they are likely to arise for other devices or for other wiring layers as well when these devices or wiring layers reach comparable dimensions.

SUMMARY

According to one aspect of the present invention, an improved hard mask layer stack for patterning a layer to be patterned is provided, including a carbon layer disposed on top of the layer to be patterned, a silicon oxide layer or a silicon oxinitride layer disposed on top of the carbon layer and a silicon layer disposed on top of the silicon oxide layer or the silicon oxinitride layer respectively.

According to another aspect of the present invention, a method of patterning a layer to be patterned is provided, including providing a layer to be patterned, providing a hard mask layer stack on the layer to be patterned, the hard mask layer stack including a carbon layer disposed on top of the layer to be patterned, a silicon oxide layer or a silicon oxinitride layer disposed on top of the carbon layer and a silicon layer diposed on top of the silicon oxide layer or the silicon oxinitride layer respectively, patterning the silicon hard mask layer in accordance with a pattern to be formed in the layer to be patterned and etching the uncovered portions of the layer to be patterned.

The hard mask layer stack according to one embodiment of the invention allows a rework if defects arise during the patterning process of the hard mask layer. Particularly, removing a photoresist layer having defects from top of the hard mask layer stack is possible without affecting the carbon hard mask layer. In one embodiment, this is advantageous if a double lithography process is used.

Since the silicon hard mask layer can be very thin, a double lithography process for small structures becomes possible. In a first patterning process, for instance, array structures with critical dimensions less than 100 nm are generated in the silicon hard mask layer by a first lithography and etching. In a second patterning process, for instance, landing pad structures and periphery structures are generated in the silicon hard mask layer by a second lithography and etching. The surface of the commonly used hard mask layer stack illustrates a high topography with steps of more than 120 nm after the first patterning process. Thus, in the second lithography the necessary depth of focus could not be reached making a double lithography process impossible. On the other hand, generating small array structures needs a lithography process and a first mask optimized with respect to the array structures, which makes a second lithography with a second mask for generating the landing pads and periphery structures necessary. The new hard mask layer stack according to one embodiment of the invention solves this problem.

The use of the above described new hard mask layer stack according to one aspect of the invention is advantageous for the double lithography process as described above, but is possible and advantageous for any process including more than one lithographic exposure and corresponding etching process referring to the same layer. Thus, only the silicon hard mask layer will be etched after a respective lithography process. Since the silicon hard mask layer is very thin, these etching processes are short, resulting in less etching damages and in possible reduction of costs. Furthermore, thin photoresist layers may be used, which is advantageous for photolithography with wave length of 193 nm and less.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 3A to 3C illustrate plan views on a plurality of subsets of landing pads according to embodiments of the invention.

FIGS. 4A to 4F illustrate cross-sectional views of the substrate at different processing steps and plan views on the substrate after those processing steps according to an embodiment of the invention.

FIGS. 5A to 5G illustrate cross-sectional views of the substrate at different processing steps and plan views on the substrate after those processing steps according to another embodiment of the invention.

FIG. 9 illustrates a plan view on the second photomask according to the first photomask of FIGS. 8A and 8B.

FIGS. 10A and 10B illustrate plan views on the first photomask according to other embodiments of the invention.

FIG. 11 illustrates a plan view on the second photomask according to the first photomask of FIGS. 10A and 10B.

FIGS. 12A to 12D illustrate plan views on the first photomask according to yet another embodiment of the invention.

DETAILED DESCRIPTION

Figure 1A:
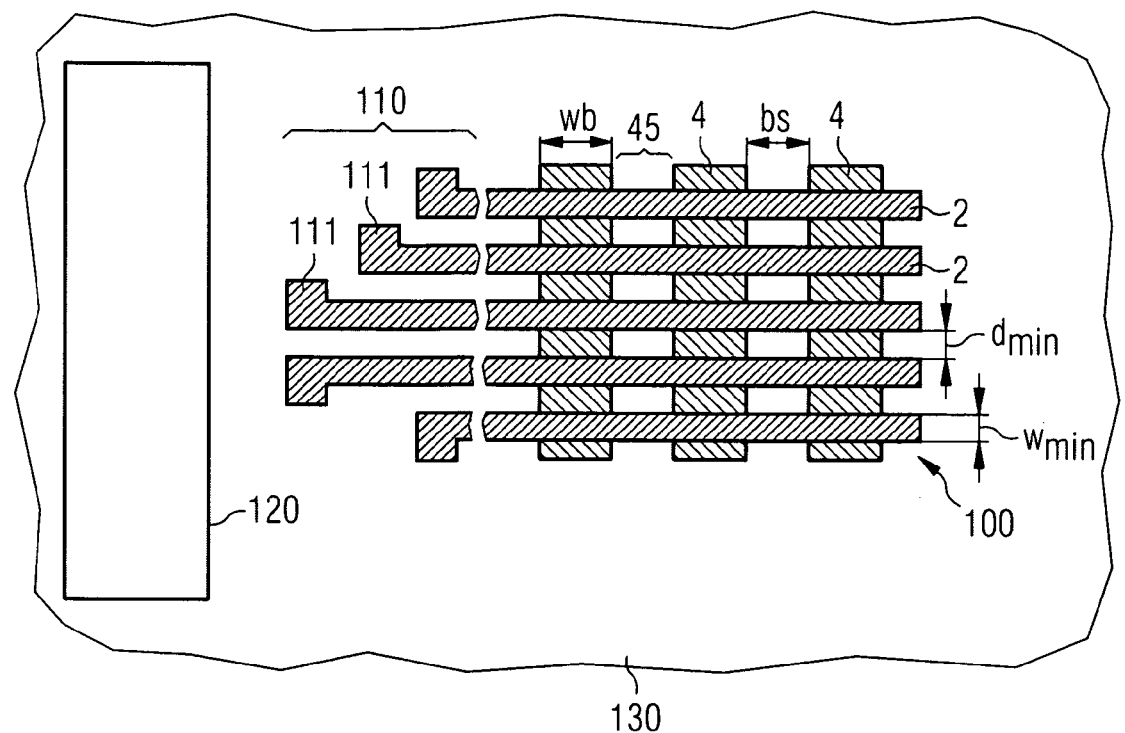
FIGS. 1A and 1B illustrate plan views on conventional devices.
Figure 1B:
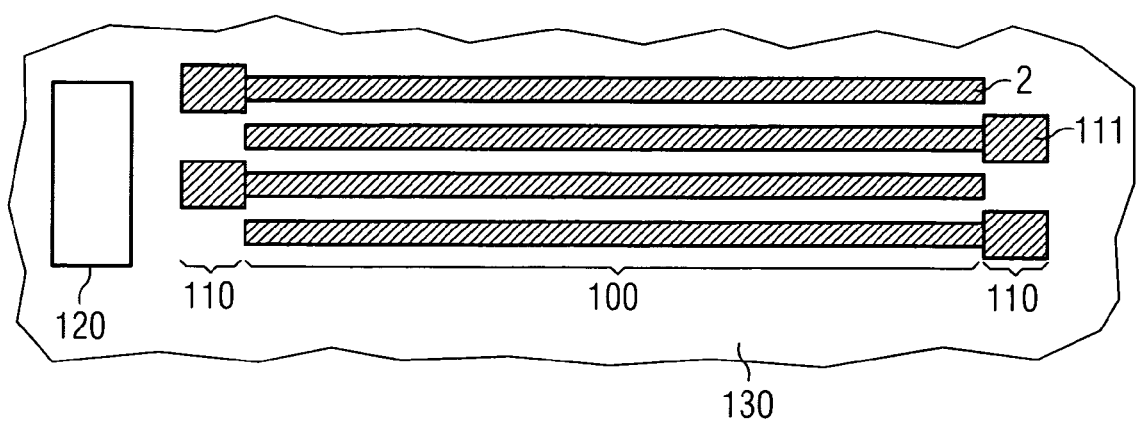

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated, as they become better understood by reference to the following detailed description. The elements of the drawings are not necessarily to scale relative to each other. Like reference numerals designate corresponding similar parts.

Figure 2A:
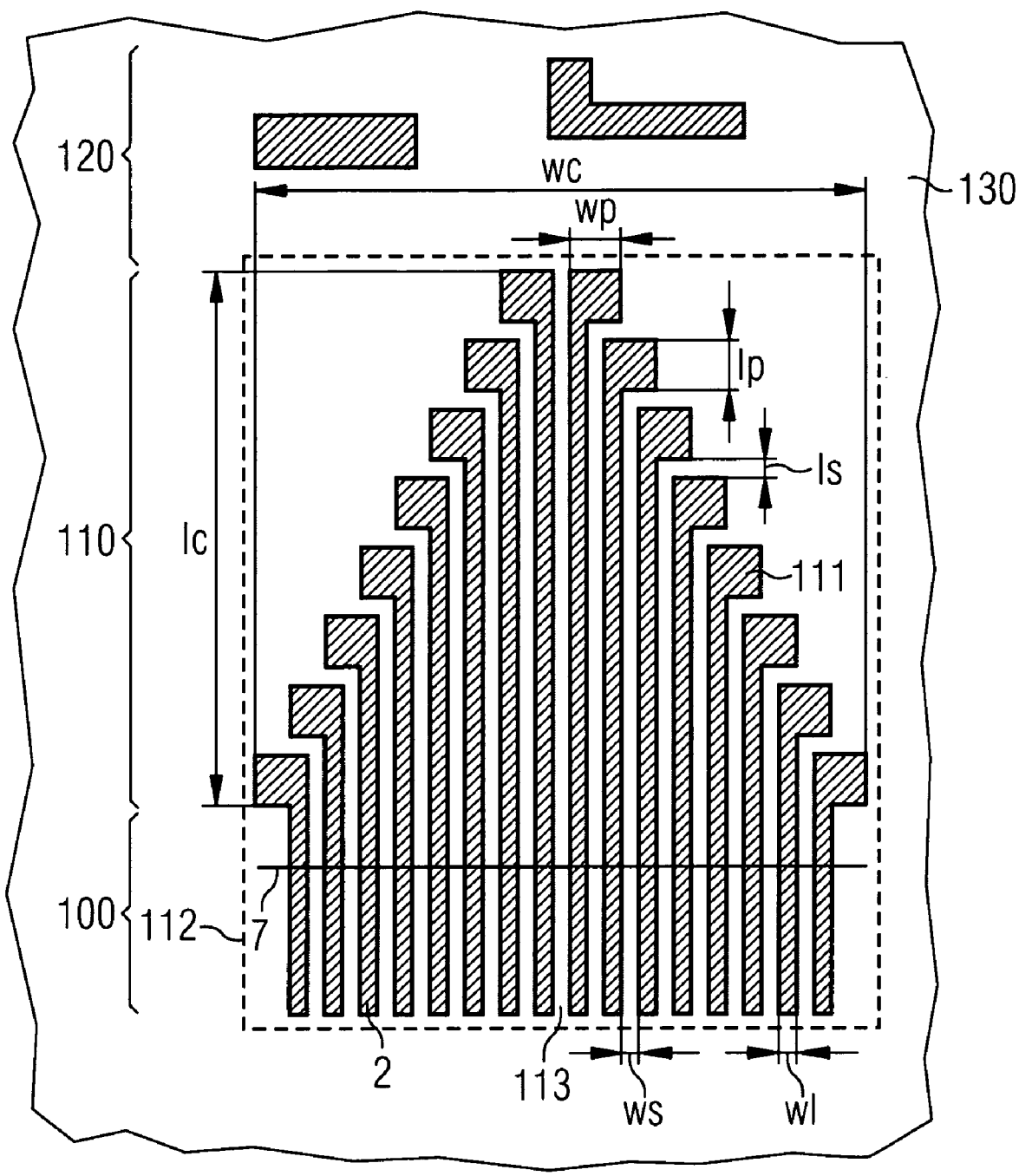
FIG. 2A illustrates a plan view on a memory device with symmetrical landing pads.

FIG. 2A illustrates a plan view on an arrangement of word lines including landing pads according to a first embodiment of the present invention. In particular, FIG. 2A illustrates a memory device 130 including a memory cell array region 100, a contact region 110 with a plurality of landing pads 111 and a peripheral region 120. Each landing pad 111 is connected with a word line 2 extending from the array region 100 into the contact region 110. The device may further include a plurality of second conductive lines (not shown) running along a second direction, the second direction intersecting a first direction of the word lines 2, and a plurality of memory cells. Each memory cell can be accessible by addressing corresponding ones of said word lines 2 and said second conductive lines or a pair of second conductive lines. The second conductive lines may be formed in or on the surface of a substrate and may correspond to bit lines of the memory device. The memory cells include for example non-volatile memory cells like NROM or Floating gate cells, but may include other types of memory cells as well.

The landing pads 111 and corresponding word lines 2 may be arranged in a plurality of subsets. In the illustrated drawing, a subset 112 of landing pads 11 and word lines 2 is defined by sixteen word lines 2 with connected landing pads 111. Nevertheless, as is clearly to be understood, subsets can be defined also by other numbers of word lines and landing pads. The subsets may be separated by conductive lines which are not connected to corresponding landing pads and which are removed in a later process step in order to contact underlying conductive layers.

The landing pads 111 of a subset 112 are arranged in a staggered fashion with increasing distance with respect to a reference position 7 of the memory device and symmetrically with respect to a space 113 between two word lines in the middle of the subset 112. Thus the subset 112 is divided in two halves by the space 113. The landing pads 111 in each half of a subset are arranged with an increasing distance with respect to the reference position 7, starting with a first landing pad 111 connected with the word line 2 at the boundary of the subset 112 and having the smallest distance to the reference position 7 and ending with a landing pad 111 connected with one of the two word lines 2 in the middle of the subset 112 and having the largest distance to the reference position 7. The smallest and the largest distance of the landing pads 111 in each half are the same for both halves of the subset 112. Thus the arrangement of the landing pads 111 in the subset 112 looks like a Christmas tree with symmetrical boughs, but without the top in the middle, or like a trapezium with the long parallel side adjacent to the array region 100 and the short parallel side arranged at a larger distance with respect to the reference position 7 the distance measured along the word lines 2.

Typically, the width w1 of the word lines 2 is smaller than 70 nm, in particular smaller than 65 nm, and the pitch, that is the sum of line width w1 and the space width ws, is smaller than 140 nm, in particular smaller than 130 nm. From the lithographic point of view, having the same line and space width would be preferable, nevertheless, this is not necessary. Although, lines and spaces having equal widths are depicted in the following figures, lines and spaces may have also different widths.

Each landing pad has a width wp measured perpendicular to the direction of the word lines and a length lp measured along the direction of the word lines wherein wp and lp are larger than w1. Typically, wp is smaller than 350 nm and lp is smaller than 300 nm. In particular, wp is about 188 nm and lp is about 250 to 300 nm. Thus, lp and wp are larger than w1. The distance ls between two adjacent landing pads measured along the direction of the word lines is about 150 to 350 nm resulting in a pitch of the landing pads (lp+ls) of 450 to 600 nm. As can be seen, lp+ls is smaller than 10×w1.

The subset 112 has a length lc measured along the direction of the word lines and a width wc measured perpendicularly with respect to the direction of the word lines, both dimensions being dependent on the dimensions and pitches of word lines and landing pads and of the number of word lines forming a subset. In particular, lc is about 3.3 to 4.5 μm and wc is about 2.25 μm for the depicted subset containing 16 word lines.

Nevertheless, the dimensions of the landing pads and conductive lines as well as the arrangement of the landing pads can be defined arbitrarily in accordance with the restrictions of the device at all and the manufacturing process.

Figure 2B:
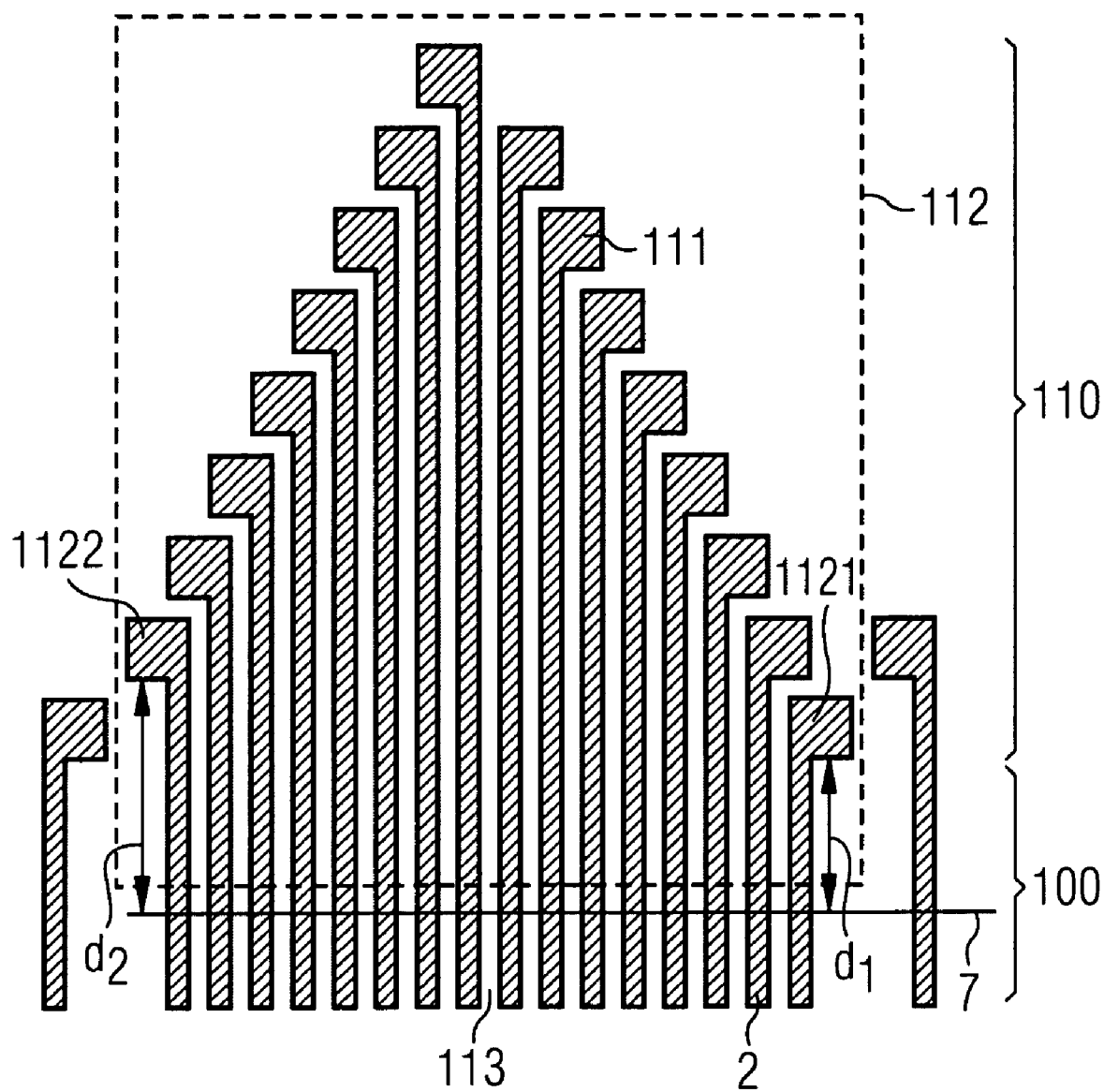
FIG. 2B illustrates a plan view on a memory device with asymmetrical landing pads.

FIG. 2B illustrates a plan view on a further embodiment of the invention. In particular, FIG. 2B illustrates a memory device 130 as described in FIG. 2A, but with landing pads 111 arranged asymmetrically with respect to a space 113 between two word lines in the middle of the subset 112. As can be seen, the first landing pad 1122 of the left half of the subset is arranged at a larger distance with respect to the reference position 7 than the fist landing pad 1121 of the right half of the subset, in other words, the distance d2 is larger than the distance d1. The landing pad with the largest distance of all landing pads of the subset is arranged at the left side of the corresponding word line 2. Nevertheless, it can be arranged at the right side or on top of the corresponding word line as well. Thus the arrangement of the landing pads 111 in the subset 112 looks like a Christmas tree with a top, but with asymmetrical boughs, or like a triangle.

FIG. 3A illustrates a plan view on a plurality of subsets 112 of landing pads according to one embodiment of the present invention. The landing pads in each subset are arranged symmetrically with respect to a space 113 between the two word lines in the middle of the subset. In the following only the landing pads of one half of each subset are considered, but the landing pads of the other halves are arranged in the same way. The first subset 112a has a first landing pad 1121a at the boundary to the second subset 112b having a first landing pad 1121b at this boundary. The first landing pads 1121a and 1121b are the landing pads with the smallest distance of all landing pads of the considered half of respective subset to a reference position 7 of the memory device the distance measured along the direction of the word lines 2. The landing pads 1121a and 1121b are arranged at the same distance with respect to the reference position 7.

FIG. 3B illustrates a plan view on another arrangement of a plurality of subsets 112 of landing pads according to a further embodiment of the invention. The landing pads 111 of each subset 112 are arranged asymmetrically with respect to a space 113 between the two lines in the middle of the subset. Thus the landing pad 1122b which is the landing pad of the left half of the subset 112a with the smallest distance to a reference position 7 is arranged at a larger distance d2 with respect to the reference position 7 than the first landing pad 1121a at the right half of the subset 112a having a distance d1 to the reference position 7. The same applies to the subset 112b. Thus, the landing pads 1121a and 1122b adjacent to the boundary of the subsets 112a and 112b are arranged at a different distance with respect to a reference position, differently stated d2>d1. Thus the space between two adjacent subsets 112 can be reduced or the dimensions of the landing pads 111 can be increased without the risk that the first landing pads 1121a and 1122b of two adjacent subsets contact or affect each other.

If the conductive lines are arranged homogeneously in a direction perpendicular to the direction of the lines and the first landing pads of two adjacent subsets of landing pads are arranged at the same distance with respect to a reference position as described with respect to FIG. 3A, the width wp of the first landing pads of each subset has to be smaller than one and a half of the pitch, that is the sum of the width w1 of the conductive lines and the distance ws between two conductive lines. Through arranging the first landing pads of adjacent subsets at different distances, the width wp of the first landing pads, which is the critical one, can become as large as two and a half of the pitch without contacting or affecting each other. Therefore the area of the landing pads can be increased resulting in a better contact resistance property and in relaxed overlay specifications for contacting an upper wiring layer.

Figure 3C:
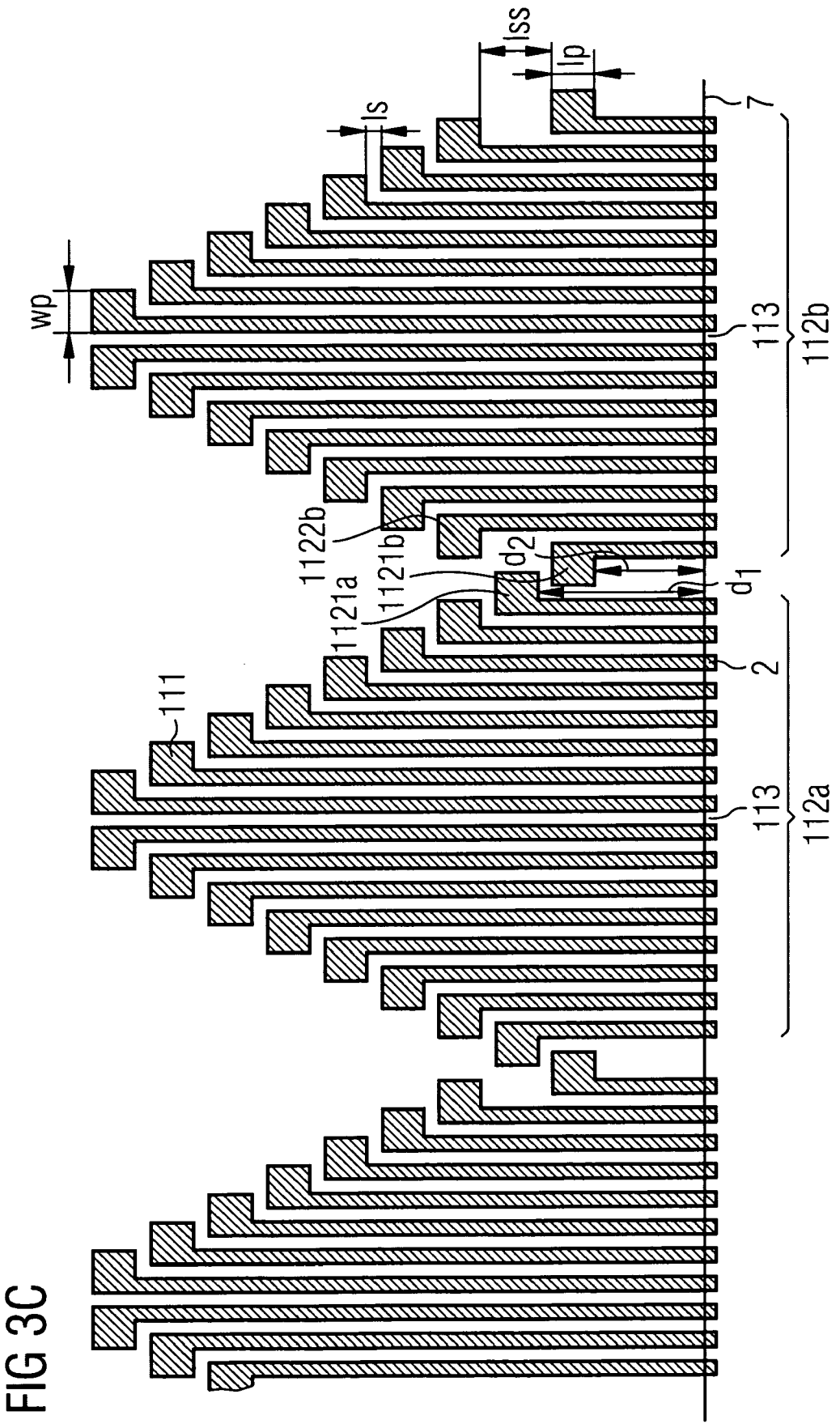

FIG. 3C illustrates a plan view on yet another arrangement of a plurality of subsets 112 of landing pads according to an embodiment of the memory device. Here the landing pads of a subset are arranged symmetrically with respect to a space 113 between the two lines in the middle of the subset. The first landing pad 1121a of the subset 112a has a larger distance d1 with respect to a reference position 7 than the first landing pad 1121b of the subset 112b having a distance d2, the distance measured along the direction of the word lines. In the subset 112b, a space between the first and the second landing pad 1121b and 1122b is provided in that way that the first landing pad 1121a of the subset 112a can reach into this space. The space has a length lss which may be defined by lss=lp+2×ls, where lp is the length of a landing pad 111 and ls is the length of the space between two adjacent landing pads, the length measured along the direction of the word lines 2. Thus, the space between two adjacent subsets can be reduced or the width wp of the first landing pads of each subset and the other landing pads as well can be increased without landing pads contacting or affecting each other. Furthermore, the distance of the landing pad with the largest distance of one subset is the same for all subsets, which can be useful during processing of the memory device.

The following cross-sectional views illustrating different processing steps illustrate views of the contact region 110, wherein the left side is taken between II and II and the right side is taken between III and III as is illustrated in FIG. 3A. The arrangement of landing pads and subsets of FIG. 3A is taken by the way of example. Nevertheless, the illustrated process is comparable for other arrangements or devices as well. By the way of example, positive photoresists 23, 231 and 232 and according photomasks are used in order to describe the inventive method.

In the further description of the invention, the steps of patterning a layer stack and of removing the uncovered portions of the layer stack will be defined as etching processes. Nevertheless, other processes are possible to perform these steps. Optionally, thereafter, the hard mask material is removed. Nevertheless, the hard mask material can as well be automatically removed by the previous etching steps, or it can be maintained, for example, serving as an insulating layer.

Starting point for performing the method of the present invention is a semiconductor substrate, in particular, a silicon substrate, which may be p-doped. The semiconductor substrate may include any type of semiconducting substrate, like for instance silicon, SOI or others, which may already be processed and thus may include doped regions or may have a topographic surface. Furthermore, several layers may be disposed on the surface of the semiconducting substrate or on parts of it, like for instance conductive or dielectric layers.

By way of example, a gate oxide layer is grown by thermal oxidation in a substrate portion in which a peripheral portion of a memory device is to be formed. In an array portion, a storage layer stack is deposited including a first $SiO_2$ layer having a thickness of 1.5 to 10 nm, a $Si_3N_4$ layer having a thickness of 2 to 15 nm followed by a second $SiO_2$ layer having a thickness of 5 to 15 nm. The storage layer stack is patterned so as to form lines. After covering the lines with a protective layer and forming spacers adjacent to the sidewalls of the lines of the layer stack, an implantation step is performed so as to define the source/drain regions in the exposed portions.

A bit line oxide is provided by performing a deposition step, followed by a step of depositing a word line layer stack. These steps are well known to the person skilled in the art of NROM devices, and a detailed description thereof is omitted.

FIGS. 4A to 4F illustrate cross-sectional views of the substrate at different processing steps and plan views on the substrate after those processing steps according to an embodiment of the method of the invention.

As is illustrated in FIG. 4A, as a result, on the surface 10 of the semiconductor substrate 1, in particular, a p-doped semiconductor substrate, in the contact region 110, a word line layer stack 20, a cap layer 21 and a hard mask layer 22 are disposed. The word line layer stack 20 usually includes segments of a first polysilicon layer and a second polysilicon layer having a total thickness of approximately 70 to 110 nm, followed by a titanium layer (not shown), a tungsten nitride layer having a thickness of approximately 5 to 20 nm and a tungsten layer having a thickness of approximately 50 to 70 nm. On top of the tungsten layer, a silicon nitride layer 21 having a thickness of approximately 100 to 200 nm is disposed.

The hard mask layer may be a layer stack including layers of different materials which can be arbitrarily selected. Nevertheless, the hard mask layers must be able to be selectively etched with respect to each other and with respect to the material of the top most layer of the conductive layer stack. Examples for the hard mask materials include amorphous silicon and carbon. In particular, such a carbon layer is made of elemental carbon, that is, carbon which is not contained in a chemical compound, optionally including additives such as hydrogen. The carbon layer may be deposited using known methods like a CVD method.

In FIG. 4A, the hard mask layer 22 is made of amorphous silicon. The hard mask layer 22 can have a thickness of approximately 100 nm or more.

A photoresist layer 23 is deposited on the resulting surface and exposed using a first photomask 51. The resulting structure is illustrated in FIG. 4A as a cross-sectional view and in FIG. 4B as a plan view. Those portions of the photoresist layer 23 illuminated become solulable by a developer. In particular, the photoresist layer 23 is exposed with a lines/spaces pattern, wherein the spaces may have interruptions. Differently stated, the spaces in the first photomask are interrupted by opaque portions connecting the opaque lines in the first photomask. Nevertheless, other embodiments of the lines/spaces patterns are possible as will be described in FIG. 10 or 12. The peripheral region 120 is not exposed by the first exposure. The structures 23a in FIGS. 4A and 4B describe exposed patterns and the structures 23b describe unexposed patterns in the photoresist 23, respectively.

As is commonly used, an antireflective coating (ARC) layer may be disposed on top of the hard mask layer, for example, a hard mask layer which includes carbon. In particular, if carbon is taken as a hard mask material, it is necessary to deposit an SiON layer on top of the carbon layer in order to enable the resist strip. In addition, the ARC layer can be disposed beneath the photoresist layer.

Figure 4D:
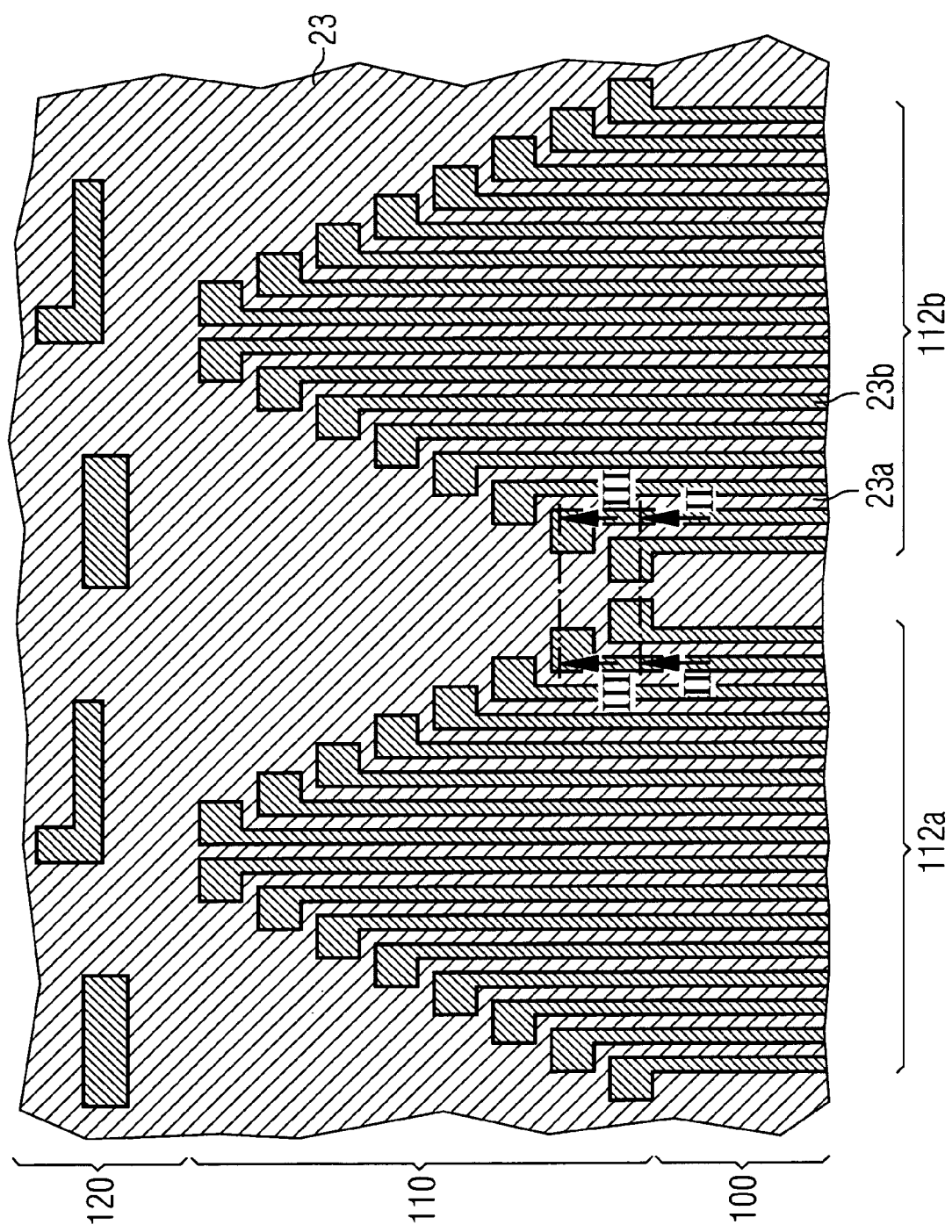

In the next step, the photoresist 23 is exposed using a second photomask 52. Thus, patterns of the first photomask 51 and the second photomask 52 are imaged into the same photoresist 23. The resulting structure is illustrated in FIG. 4C as a cross-sectional view and in FIG. 4D as a plan view, wherein those portions of the photoresist layer 23 illuminated become solulable by a developer. In particular, the photoresist layer 23 is exposed with patterns in that way, that in the developed photoresist lines with connected landing pads are defined and where the landing pads are arranged in the interruptions of the exposed structures of the first exposure.

Furthermore, lines arranged between two subsets of word lines are exposed in the contact region 110 and the array region 100. Thus the hard mask 22, the silicon nitride layer 21 and the word line layer stack 20 can be removed from these portions in the array region in order to contact underlying bit lines 4 in a later process step. Thus, an additional lithography process for opening this region can be saved resulting in decreasing costs and improving yield. Moreover, patterns in the peripheral region 120 can be defined by the second exposure. Again, structures 23a describe exposed patterns and structures 23b describe unexposed patterns in the photoresist, respectively.

In the next step, the photoresist 23 is developed and the resulting patterns are transferred to the hard mask layer 22. In particular, an etching step is performed, taking the photoresist mask as an etching mask. After removing the photoresist material 23, the patterns of the hard mask layer 22 are transferred into the silicon nitride layer 21 and the remaining hard mask layer 22 is removed. The structure illustrated in FIG. 4E in a cross-sectional view and in FIG. 4F in a plan view is obtained, wherein single lines 211 and single landing pads 212 of silicon nitride are formed on the surface of the word line layer stack 20. Nevertheless, the hard mask layer 22 can be maintained.

In a later process step, the patterns of the silicon nitride layer 21 are transferred into the word line stack 20, thereby simultaneously defining single word lines 2 and single landing pads 111 each connected with a selected ones of the word lines. Since this step is well known to the person skilled in the art, a detailed description thereof is omitted.

Referring to FIGS. 4A to 4F, the conductive lines obtained by patterning the conductive layer stack correspond to word lines 2 of a memory device, the word lines 2 being disposed above another conductive layer including bit lines 4 of that memory device. The memory device further includes memory cells, each of the memory cells being able to be accessed by addressing a corresponding word line 2. Nevertheless, as is clearly to be understood, the conductive lines can as well correspond to the bit lines 4 or any other wiring on a dense pitch, that is a pitch smaller than 140 nm.

Separating the exposures of the word lines and of the landing pads allows to optimize each exposure and each photomask with respect to the imaged structures. Furthermore, the hard mask can be removed from portions of the array region 100, where the underlying bit lines have to be contacted in a later process step, in the second exposure. That is, the hard mask is removed in an earlier processing step than in conventionally used methods without disturbing the homogeneity of the imaged space/line structures. Thus, imaging of small line structures with the first photomask in a first exposure is possible and a further lithography step to remove word lines from the array region described above is saved.

FIGS. 5A to 5G illustrate cross-sectional views of the substrate at different processing steps and plan views on the substrate after these processing steps according to another embodiment of the method of the invention using two separate lithography steps. Each lithography step includes imaging patterns into a separate photoresist and developing this photoresist. The patterns in the respective photoresist are transferred separately into a hard mask layer stack.

Thus, the separated lithography processes can be optimized for imaging the respective structures without affecting the imaging of the other structures. In particular, the illumination parameters can be optimized for imaging line and space structures. Smaller dimensions of lines in the photoresist layer can be achieved compared to a double exposure process that images patterns of both photomasks into the same photoresist layer as described above. Since the mechanical stress to the photoresist lines is more homogeneous in the first exposure, where the line and space structures are homogeneously arranged, smaller line widths can be achieved. If the patterns of the second photomask are imaged into the same photoresist layer, photoresist lines having small widths and being adjacent to relatively large regions without photoresist may collapse when the photoresist is developed. This is avoided by separating the imaging of patterns of the first and second photomasks.

Moreover, a rework of the second lithography process can be done without the need of repeating the first exposure. Furthermore, not only the lithography processes can be optimized with respect to the structures, but also the process of providing the second photoresist and the etching processes profit from such an optimization of structures, in particular from a homogeneous arrangement of structures, resulting in the possibility to further reduce structure dimensions.

The steps of etching the hard mask layer stack after the first and the second lithographic process may be performed so that after the first lithographic process only the top most layer of the hard mask layer stack is etched. After the second lithographic process, the patterns in the second photoresist are transferred into the top most hard mask layer. The resulting pattern in the top most hard mask layer is transferred to the other layers of the hard mask layer stack, after removing the second photoresist from the hard mask layer stack. Thus, the other hard mask layers can be etched without being affected by photoresist residues or other effects resulting from photoresist on top of the hard mask.

Figure 5A:
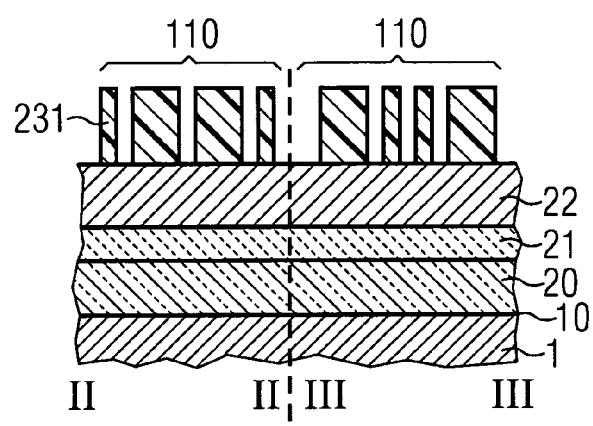
Figure 5B:
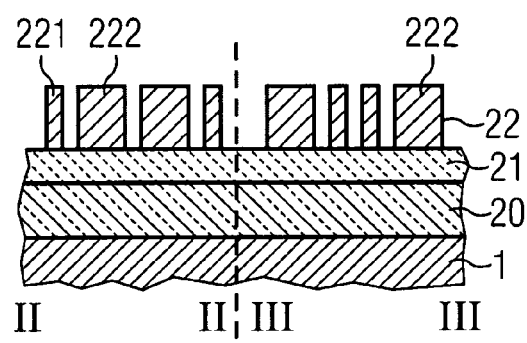

As is illustrated in FIG. 5A, on the surface 10 of the semiconductor substrate 1, in particular, a p-doped semiconductor substrate, in the contact region 110, a word line layer stack 20, a silicon nitride layer 21 and a hard mask layer 22 are disposed, as described with respect to FIG. 4A.

A first photoresist layer 231 is deposited on the resulting surface, exposed using a first photomask 51 wherein the regions of the photoresist layer 231 which were illuminated become solulable by a developer and developed. The resulting structure is illustrated in FIG. 5A. In particular, the photoresist layer 231 is exposed with a line/space pattern, wherein the spaces in the first photomask may be interrupted by opaque segments of line which connect the opaque lines. Nevertheless, other embodiments of the line/space patterns are possible as will be described in FIG. 10 or 12. As a result, the photoresist 231 forms continuous lines in the array and contact regions, two adjacent lines being spaced apart from each other by a corresponding space structure and being connected with each other by the segment of line of the corresponding space structure that forms a bridge in the interruption of the space between the lines. In the spaces the hard mask layer 22 lies on the surface of the substrate. The peripheral region 120 may be not exposed by the first exposure.

In the next step, the patterns of the first photoresist 231 are transferred into the hard mask layer 22. In particular, an etching step is performed, taking the photoresist mask as an etching mask. After removing the photoresist material 231, the structure illustrated in FIG. 5B in a cross-sectional view and in FIG. 5C in a plan view is obtained, wherein single lines 221 of the hard mask material 22 are formed which are connected by bridges 222 of the hard mask material 22. In the spaces between the lines 221 the silicon nitride layer 21 lies on the surface of the substrate.

Figure 5D:
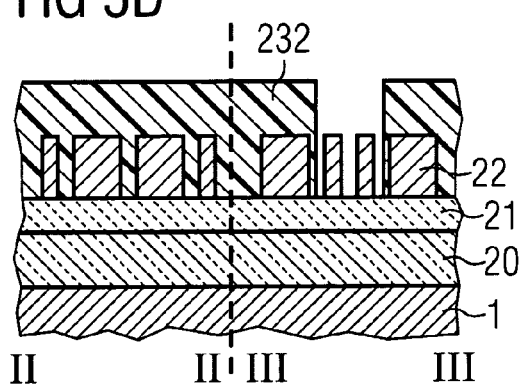
Figure 5F:
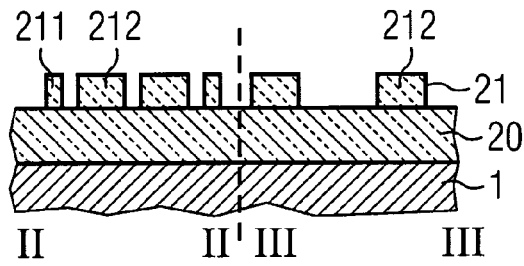

In the next step, a second photoresist 232 is deposited on the resulting surface, exposed with a second photomask 52 wherein the regions of the photoresist layer 232 which where illuminated become solulable by a developer and developed. Again an ARC layer can be used as described above. The resulting structure is illustrated in FIG. 5D in a cross-sectional view and in FIG. 5E in a plan view. In particular, the photoresist layer 232 is exposed in that way, that in the developed photoresist patterns are defined that cover lines with connected landing pads in the array and contact regions. Furthermore, portions arranged between two subsets of word lines are exposed in the array and the contact regions 100 and 110. Thus the hard mask lines 221 and the underlying layers 21 and 20 can be removed from these portions in the array region in order to contact underlying bit lines 4 in a later process step. Moreover, patterns in the peripheral region 120 can be defined by the second exposure.

In the next step, patterns of the second photoresist 232 are transferred to the hard mask layer 22. In particular, an etching step is performed, taking the photoresist mask as an etching mask. After removing the photoresist material 232, the patterns of the hard mask layer 22 are transferred into the silicon nitride layer 21 and the remaining hard mask layer 22 is removed. The structure illustrated in FIG. 5F in a cross-sectional view and in FIG. 5G in a plan view is obtained, wherein single lines 211 and single landing pads 212 of silicon nitride are formed on the surface of the word line layer stack 20. Nevertheless, the hard mask layer 22 can be maintained.

In a later process step, the patterns of the silicon nitride layer 21 are transferred into the word line stack 20, thereby defining single word lines 2 and single landing pads 111 each connected with a selected ones of the word lines. Since this step is well known to the person skilled in the art, a detailed description thereof is omitted.

One embodiment of the manufacturing method described with respect to the FIG. 5 is advantageous with respect to the first patterning step of hard mask layer 22 and the deposition of the second photoresist 232 since the pattern of the first photoresist and therefore the pattern in the hard mask layer 22 after the first patterning process are very homogeneous. Furthermore, the line structures imaged by the first exposure, in particular, the width of the lines in the contact region 110, are not affected by the second exposure, in particular, not affected by stray light due to the second exposure, since the first and the second exposure are not carried out into the same photoresist.

Figure 6:
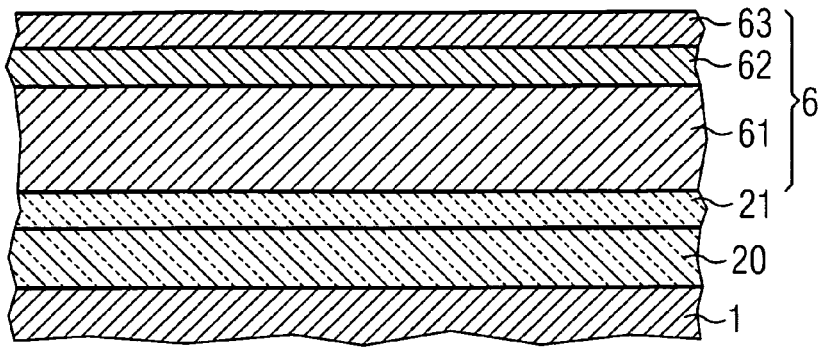
FIG. 6 illustrates a cross-sectional view of the new hard mask.

FIG. 6 illustrates a cross-sectional view of a new hard mask layer stack according to the invention. On the surface 10 of a semiconductor substrate 1, for example, a word line layer stack 20, a silicon nitride layer 21 and a hard mask 6 are disposed. The hard mask 6 includes three layers 61 to 63 of different materials. The first hard mask layer 61 is, for example, a carbon layer. Such a carbon layer is made of elemental carbon, that is, carbon which is not contained in a chemical compound, optionally including additives such as hydrogen. The carbon layer may be deposited using known methods like a CVD method. The hard mask layer 61 can have a thickness of approximately 100 nm to 150 nm. The second hard mask layer 62 is made of silicon oxide, for example, having a thickness of about 10 nm to 30 nm. The second hard mask layer 62 may be made of silicon oxinitride as well. The third hard mask layer 63 is made of silicon, for example, wherein the silicon layer may be made of any type of silicon like amourphous, poly- or monocrystalline silicon having a thickness of about 10 nm to 50 nm, in particular about 20 to 30 nm.

The materials and thicknesses of the hard mask layers 61 to 63 can arbitrarily be selected as far as sufficient etch selectivities with respect to each other and the materials of the underlying layers are given. In particular, the layers 62 and 63 has to be etched selectively to each other, and the layer 61 has to be etched selectively to the underlying layer 21. Differently stated, when etching layer 63 the layer 62 should be removed with an etch rate much smaller than that of layer 63, and when etching layer 62 the layer 63 should be removed with an etch rate much smaller than that of layer 62.

The thickness of the layer 61 may be larger than that of the layer 62, and the thickness of the layer 62 may be larger than the thickness of the layer 63.

It is obvious that such a hard mask layer stack may be used to pattern any kind of underlying layer and that its use is not limited to conductive layers adjacent to the carbon hard mask layer.

Embodiments of this new hard mask layer stack has different advantages as described with respect to FIG. 7. FIGS. 7A to 7D illustrate cross-sectional views of the substrate at different processing steps according to the embodiment of the method of the invention described in FIG. 5, but using the new hard mask layer stack 6. The plan views of the structures after the different processing steps are omitted, since they correspond to the plan views illustrated in FIGS. 5C, 5E and 5G with structures patterned in the third hard mask layer 63 in FIGS. 5C and 5G.

Figure 7A:
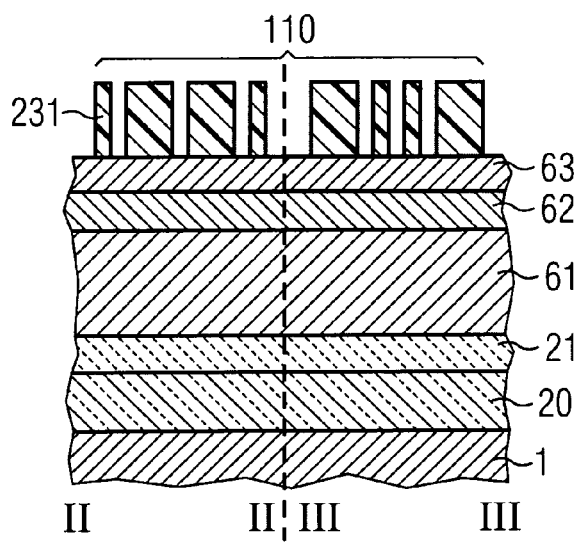
FIGS. 7A to 7D illustrate cross-sectional views of the substrate at different processing steps using the new hard mask.

As is illustrated in FIG. 7A, on the surface 10 of the semiconductor substrate 1 in particular, a p-doped semiconductor substrate, in the contact region 110, a word line layer stack 20, a silicon nitride layer 21 and a hard mask layer stack 6 including layers 61 to 63 are disposed, as described with respect to FIG. 4A. The hard mask layer stack includes a carbon layer 61, a silicon oxide layer 62 and a silicon layer 63, as described with respect to FIG. 6.

A first photoresist layer 231 is deposited on the resulting surface, exposed using a first photomask 51 wherein the regions of the photoresist layer 231 which where illuminated become solulable by a developer and developed. The resulting structure is illustrated in FIG. 7A. In particular, the photoresist layer 231 is exposed with a line/space pattern, wherein the spaces may have interruptions as described above with respect to FIGS. 4 and 5. Nevertheless, other embodiments of the line/space patterns are possible as will be described in FIG. 10 or 12. The peripheral region 120 may not be exposed by the first exposure.

Figure 5C:
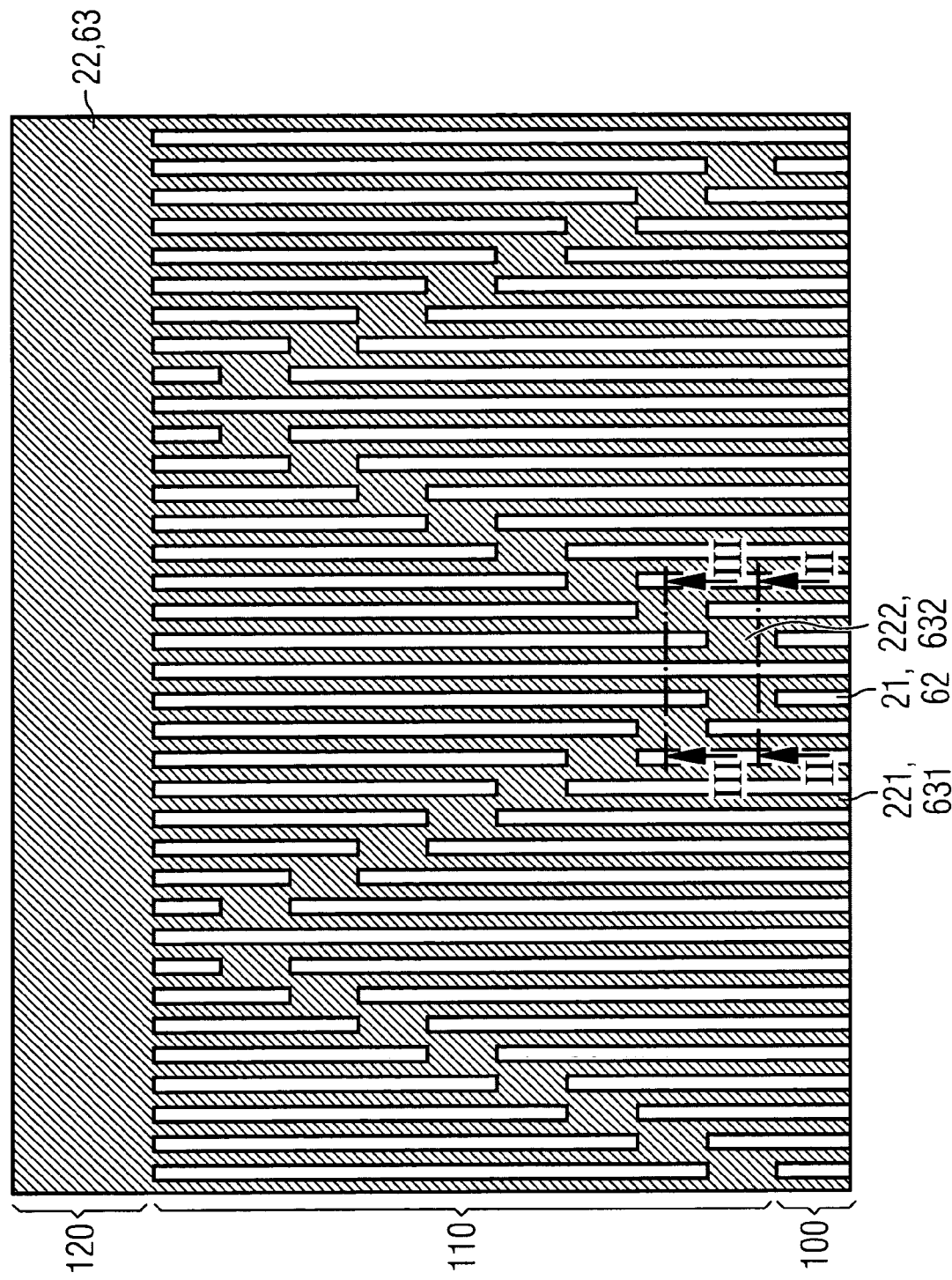
Figure 5E:
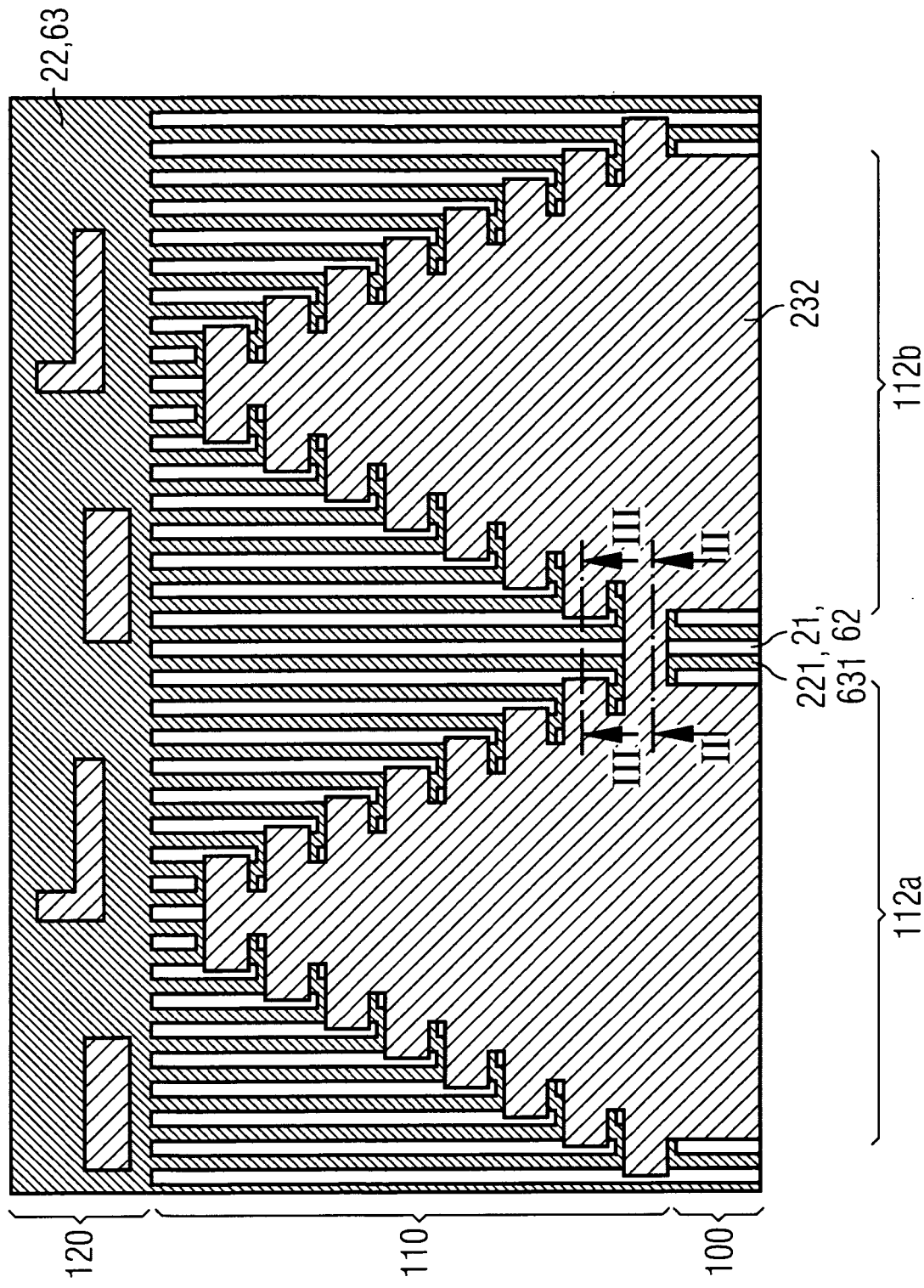
Figure 7B:
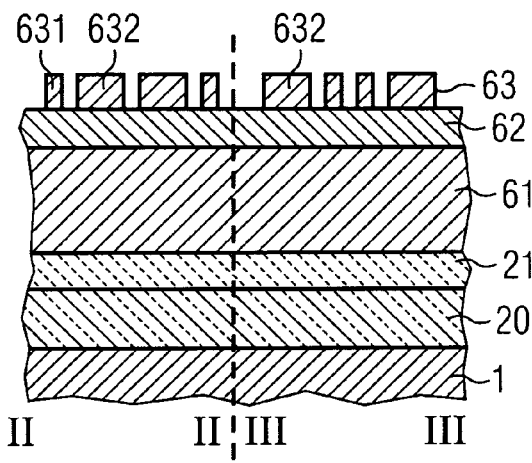
Figure 7C:
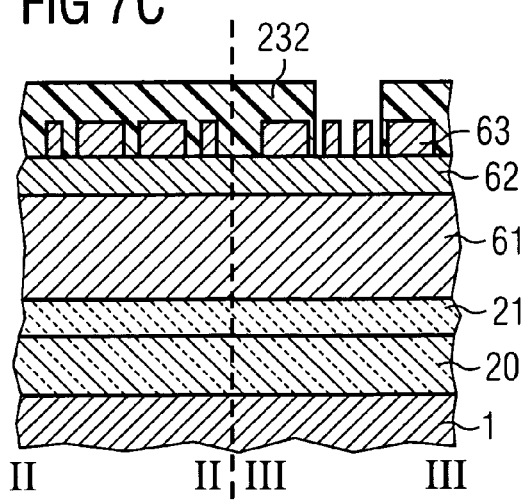
Figure 7D:
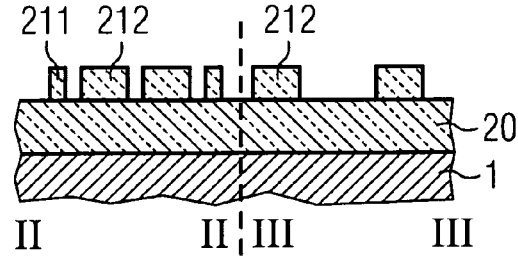

In the next step, the patterns of the first photoresist 231 are transferred into the silicon layer 63. In particular, an etching step is performed, taking the photoresist mask as an etching mask. After removing the photoresist material 231, the structure illustrated in FIG. 7B is obtained, wherein single lines 631 of silicon are formed which are connected by bridges 632 of silicon. The plan view on this structure is illustrated in FIG. 5C.

In the next step, a second photoresist layer 232 is deposited on the resulting surface, exposed using a second photomask 52 wherein the regions of the photoresist layer 232 which where illuminated become solulable by a developer and developed. The resulting structure is illustrated as a cross-sectional view in FIG. 7C and as a plan view in FIG. 5E. In particular, the photoresist layer 232 is exposed with patterns in that way, that in the developed photoresist lines with connected landing pads are defined. Furthermore, lines arranged between two subsets of word lines are exposed in the array region 100. Thus the hard mask layer stack 6, the silicon nitride layer 21 and the word line layer stack 20 can be removed from these portions in the array region in order to contact underlying bit lines 4 in a later process step. Moreover, patterns in the peripheral region 120 can be defined by the second exposure.

Since the silicon layer 63 is thin with respect to a commonly used hard mask layer 22 as described with respect to FIGS. 4 and 5, the topography of the resulting surface after the first patterning of the silicon layer 63 is small. Therefore the exposure of the second photoresist 232 is not critical with respect to the depth of focus, and a double lithography process for small structures becomes possible. In the first patterning process, for instance, array structures with critical dimensions less than 100 nm are generated in layer 63 by a first lithography and etching. In the second patterning process, for instance, landing pad structures and periphery structures are generated in layer 63 by a second lithography and etching. Conventionally, the surface of the commonly used hard mask layer stack illustrates a high topography with steps of more than 120 nm after the first patterning process. Thus, in the second lithography the necessary depth of focus could not be reached making a double lithography process impossible. On the other hand, generating small array structures needs a lithography process and a first mask optimized with respect to the array structures, which makes a second lithography with a second mask for generating the landing pads and periphery structures necessary. The new hard mask layer stack 6 according to the invention solves this problem.

In case of a commonly used hard mask with carbon used as hard mask layer 22 as described above, removing the first or the second photoresist will affect also the carbon layer. Therefore rework of the second photoresist, necessary for instance if a failure occurred during the second exposure, is impossible without detonating the edges of the structures allready patterned in the hard mask layer 22. Since in the new hard mask layer stack 6 the carbon layer 61 is protected by the layer 62, a rework of the second photoresist will not result in detonating the patterns.

In the next step, the silicon layer 63 is etched, taking the photoresist layer 232 as an etching mask. After removing the photoresist material 232, the patterns of the silicon layer 63 are transferred into the silicon oxide layer 62, the carbon layer 61 and the silicon nitride layer 21. Remaining parts of hard mask layers 63 to 61 are removed during the single etching steps or following the last etching step. The structure illustrated in a cross-sectional view in FIG. 7D and in a plan view in FIG. 5G is obtained, wherein single lines 211 and single landing pads 212 of the silicon nitride are formed. Nevertheless, one or more of the hard mask layers 63 to 61 can be maintained.

In a later process step, the patterns of the silicon nitride layer 21 are transferred into the word line stack 20, thereby defining single word lines 2 and single landing pads 111 each connected with a selected ones of the word lines. Since this step is well known to the person skilled in the art, a detailed description thereof is omitted.

Although the use of the above described new hard mask layer stack 6 is described with respect to FIG. 7, the use of the new hard mask layer stack 6 is possible and advantageous for any process including more than one lithographic exposure and corresponding etching process referring to the same layer. Thus, only the layer 63 will be etched after the first lithography process and after the second lithography process. Since the silicon hard mask layer is very thin, these etching processes are short, resulting in less etching damages and in possible reduction of costs. Furthermore, thin photoresist layers may be used, which is advantageous for photolithography with wave length of 193 nm and less.

FIGS. 8 to 14 illustrate plan views on embodiments of the first and the second photomask according to the invention or details of them. One set of photomasks according to an embodiment of the present invention includes a first and a corresponding second photomask. The first photomask is used to image the line structures, while the second photomask is used to define the landing pads connected to corresponding lines, to remove structures, which are obtained by a lithographic process using the first photomask and which are not needed for connecting word lines and landing pads, and to define structures in the peripheral region. The photomasks illustrated are masks used to expose positive photoresists. Masks used for exposing negative photoresists can be formed in the same manner, but have to have opposite structures.

Moreover, the photomasks may include regions with other structures not illustrated in FIGS. 8 to 14, particularly peripheral structures.

FIG. 8A illustrates a plan view on a first photomask 51 of a first embodiment of the inventive set of photomasks. In particular, the structures in the first photomask are arranged in a plurality of subsets, and one such subset is illustrated. In the array region 100 opaque lines 511 are arranged homogeneously, which are separated by transparent spaces 512. The widths of the lines and spaces correspond to the width w1 of the wordlines to be patterned and the distances ws between them, respectively. The line/space structures form a grating with opaque lines and transparent spaces. In the fan-out or contact region 110, the spaces 512 have first transparent segments 512a, interruptions 513 and second transparent segments 512b. The breaks or interruptions in the spaces are opaque portions interrupting the transparent spaces. The interruptions 513 thereby separate the transparent segments 512a and 512b and connect neighbouring lines 511. The interruptions 513 are arranged in a staggered fashion at different distances with respect to a reference position 7, the distances measured along the direction of the lines 511 and increasing in a direction perpendicular to the direction of the lines. The length of the interruptions measured along the direction of the lines can be slightly larger than the length lp of the landing pads to be created. The width wp of the landing pads to be created is limited by the distance of two spaces 512 adjacent to the interruption 513, thus wp<=2×w1+ws. The interruptions are arranged symmetrically with respect to a space 515 between the two middle lines of the subset of landing pads illustrated in FIG. 8A. The space 515 does not have an interruption. In the peripheral region 120, the mask is opaque. The homogeneous arrangement of lines and spaces in the array and contact region improves the imaging of the structures, thus allowing to reduce the width of the lines and spaces.

Figure 8B:
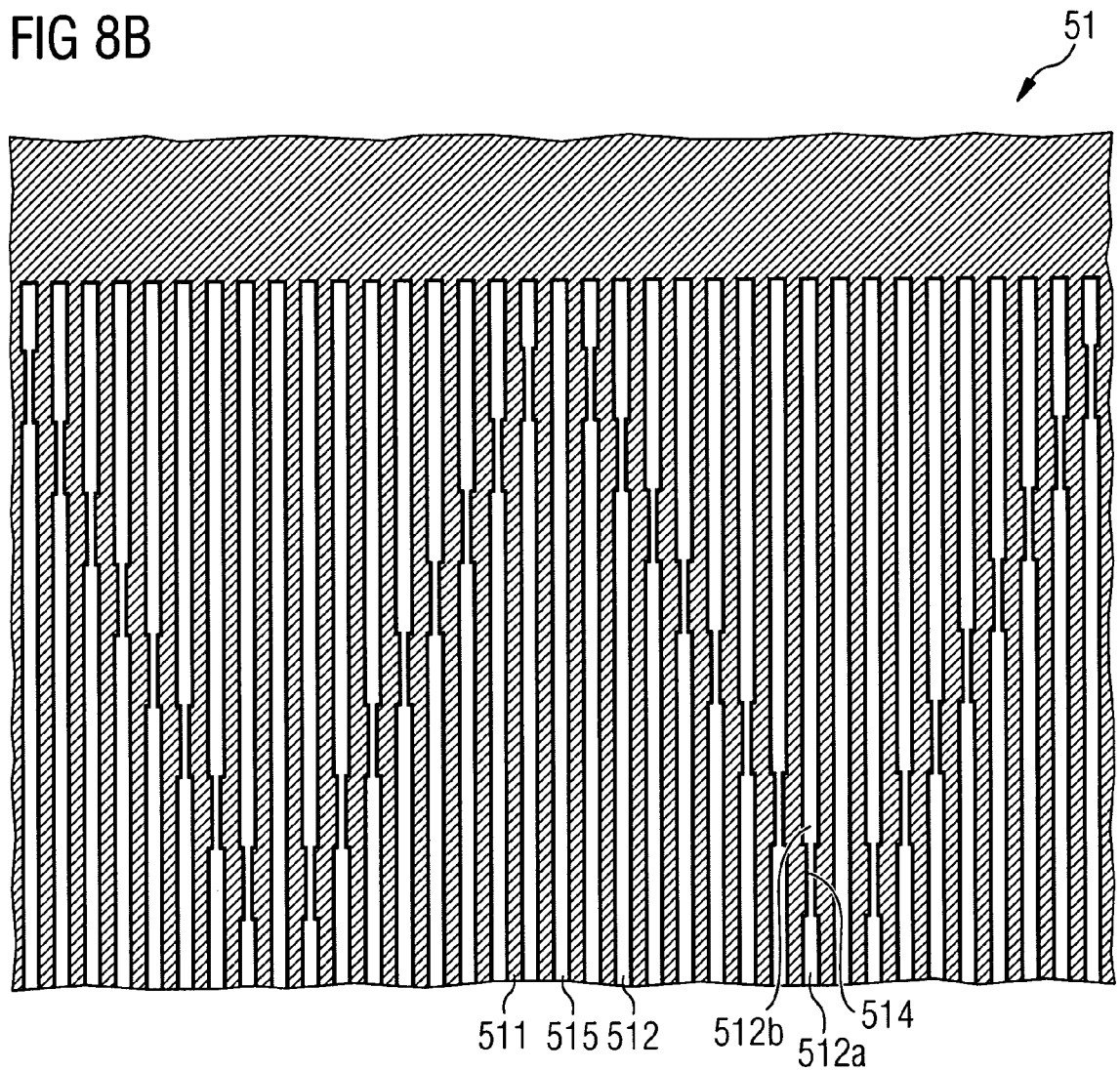
FIGS. 8A and B illustrate plan views on the first photomask according to embodiments of the invention.

FIG. 8B illustrates another embodiment of the first photomask of the present invention having also a symmetrical arrangement of lines 511 and spaces 512 in a subset 112 as described with respect to FIG. 8A, but here assist features 514 are located in the interruptions. The assist features have a width below the resolution limit of the lithographic tool and thus they are not printed. Thus, the spaces 512 are continuous spaces with a segment 512a having a width w1, a segment 514 having a width w2 and a segment 512b having a width w1, where w1>w2.

FIG. 9 illustrates a plan view on a second photomask according to the photomask set including any of the masks illustrated in FIGS. 8A and 8B. The mask including an opaque region in the array region 100, and an opaque structure in the contact region 110 in that way that the interruptions 513 of the first photomask are partially covered by the fingers 521 and the lines and spaces at the side of the interruptions 513 adjacent to the array region are entirely covered. The dimension of the opaque structures 521 covering the interruptions 513 measured along the direction of the line structures of the first photomask corresponds to the length lp of the landing pads 111 to be created.

As can be seen, there is a transparent portion 522 in the array region 100, thus exposing defined lines 511 created by the first photomask. In this portion the photoresist will not cover the lines, and opening this portion is possible in order to contact underlying bit lines in a later process step. As a result, a further lithography process for removing defined word lines at a later process step can be saved, thus improving yield and saving costs. In the peripheral region 120, structures not illustrated in FIG. 9 can be defined.

FIG. 10A illustrate a plan view on another first photomask 51 of the first embodiment of the inventive set of photomasks. In particular, as can be seen, one subset 112 of structures is illustrated with line/space structures as described with respect to FIG. 8A, but with interruptions 513 of spaces 512 arranged asymmetrically with respect to a space 515 between the two middle lines of the subset. The space 515 does not have an interruption.

FIG. 10B illustrates a plan view on another first photomask 51 of the first embodiment of the inventive set of photomasks. In particular, as can be seen, one subset 112 of structures is illustrated with line/space structures as described with respect to FIG. 8B, but with interruptions 513 of spaces 512 arranged asymmetrically with respect to a space 515 between the two middle lines of the subset.

FIG. 11 illustrates a plan view on a second photomask according to the photomask set including any of the masks illustrated in FIGS. 10A and 10B. The mask is very similar to that of the photomask illustrated in FIG. 9, but with an arrangement of the opaque region corresponding to the structures of the photomasks illustrated in FIGS. 10A and 10B. In particular, the fingers 521 are arranged asymmetrically according to the arrangement of interruptions 513 in the first photomask. Again, there is a transparent portion 522 in the array region 100 resulting in the above described advantages. In the peripheral region 120 structures not illustrated in FIG. 11 can be defined. The detail 526 of FIG. 11 will be described with respect to FIG. 14.

The photomasks, illustrated in FIGS. 8 to 11 may include non-printing assist features. Assist features like serifs or scattering bars can be arranged at the edges or boundaries of the structures in the first or second photomask. These assist features improve the lithographic imaging of the structures. Also other assist features which will be printed by the lithographic processes can be used outside the regions comprising the line structures or landing pads to further improve the imaging of structures.

Figure 12A:
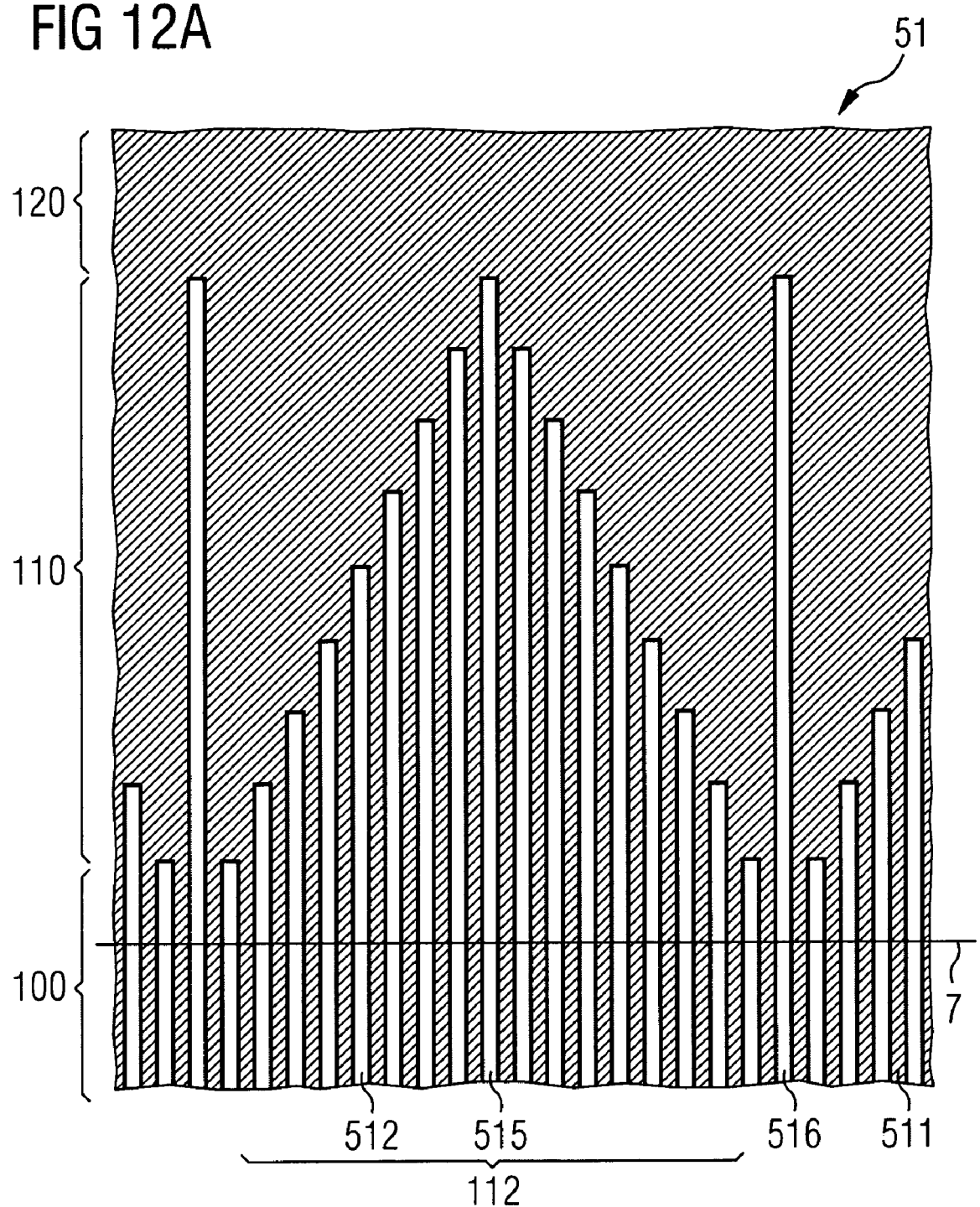

FIGS. 12A to 12D illustrate plan views on different first photomasks 51 of a second embodiment of the inventive set of photomasks. In particular, the structures in the first photomask are arranged in a plurality of subsets, and one subset 112 is illustrated in FIG. 12A. In the array region 100 opaque lines 511 are arranged homogeneously, which are separated by transparent spaces 512. The widths of the lines and spaces correspond to the width of the wordlines to be patterned and the distances between them, respectively. The line/space structures form a grating with opaque lines and transparent spaces. In the fan-out or contact region 110, the spaces 512 extend to different distances with respect to a reference position 7, the distance measured along the direction of the lines 511 and increasing within a half of the subset 112. At a distance greater than the extent of the spaces 512 the mask 51 is opaque.

Spaces 512 of one subset 112 with the same extent are arranged symmetrically with respect to a space 515 between the two middle lines of the subset. The space 516 separating two subsets 112 extends over the entire contact region 110, but other extents are possible, too. The space 516 has the function to separate the landing pads adjacent to this space that will be imaged using the second photomask. Thus, the space 516 has to extend to a distance to which the adjacent landing pads will extend. In the peripheral region 120, the mask is opaque. The homogeneous arrangement of lines and spaces in the array region improves the imaging of the structures, thus allowing to reduce the width of the lines and spaces.

FIG. 12B illustrates another embodiment of the first photomask of the present invention which is very similar to that illustrated in FIG. 12A. The photomask has also a symmetrical arrangement of spaces 512 extending to the same distance in a subset 112, but here assist features 514 are disposed adjacent to the spaces 512. Differently stated, the assist features 514 continue the spaces 512. The assist features have a width below the resolution limit of the lithographic tool and thus they are not printed. But they improve the imaging of the space/line structures in the contact region 110.

The spaces 512 extending to the same distance can be arranged asymmetrically with respect to a space 515 between the two lines in the middle of the subset 112. FIG. 12C illustrates an example of such an arrangement with assist features 514 continuing the spaces 512 in the entire contact region 110. Nevertheless, also an arrangement without such assist features is possible, similar to that illustrated in FIG. 12A.

The photomasks illustrated in FIG. 9 or FIG. 11 can be used as the second photomask 52 of the photomask set according to embodiments of the invention, respectively. The opaque structure in the contact region 110 has to extend in that way, that the fingers 521 extend to a longer distance than the corresponding spaces 512 in the first photomask 51 with respect to a reference position 7, thus defining landing pads 111 in the patterned structure. The dimension of the fingers 521 measured in the direction of the lines in the first photomask defines the length lp of the landing pads.

FIG. 12D illustrates another first photomask of the second embodiment of the photomask set according to an embodiment of the present invention. The spaces 512 of one subset extending to the same distance with respect to a reference position 7 are arranged symmetrically with respect to the space 515 between the two lines 511 in the middle of the subset. There are two different types of subsets, subset 112a and subset 112b. The space 512a that is the space adjacent to the line at the boundary of the subset 112a extends to a larger distance than the space 512b that is the space adjacent to the line at the boundary of the subset 112b. The first photomask illustrated in FIG. 12D corresponds to the structure illustrated in FIG. 3C.

Figure 13:
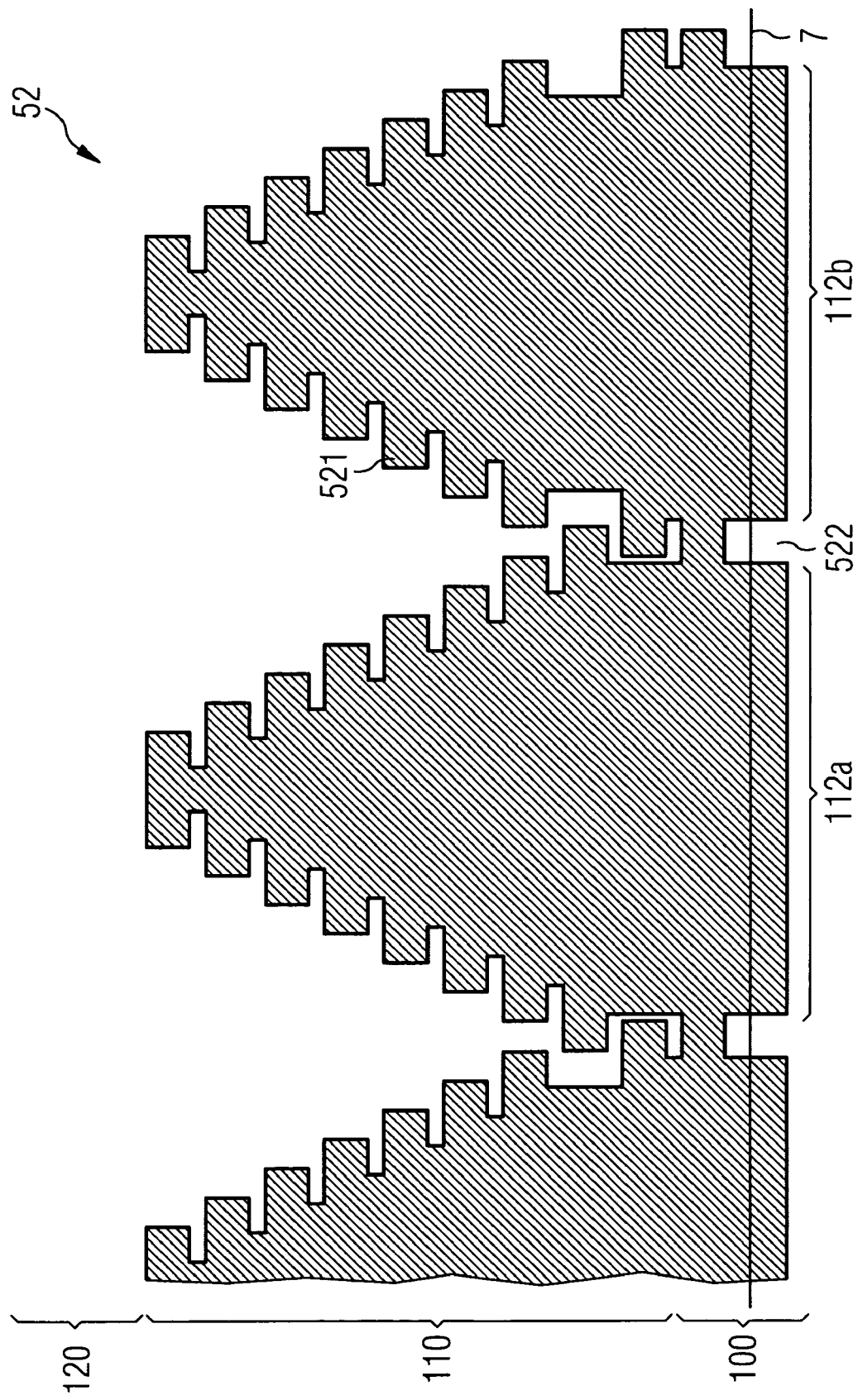
FIG. 13 illustrates a plan view on the second photomask according to the first photomask of FIG. 12D.

FIG. 13 illustrates a plan view on a second photomask according to the photomask set including the mask illustrated in FIG. 12D. The mask includes an opaque region in the array region 100, and an opaque structure in the contact region 110 in that way that the fingers 521 extend to a longer distance than the corresponding spaces 512 of the first photomask. Thus landing pads are patterned connected to adjacent lines 511. The dimension of the opaque structures 521 measured along the direction of the line structures of the first photomask corresponds to the length lp of the landing pads 111 to be created. As can be seen, there is a transparent portion 522 in the array region 100, thus exposing defined lines 511 created by the first photomask. In this portion the photoresist will not cover the lines, and it is possible to open this portion in order to contact underlying bit lines in a later process step. Therefore, a further lithography process for removing defined word lines at a later process step is saved, thus improving yield and saving costs. In the peripheral region 120 structures not illustrated in FIG. 13 can be defined. Manufacturing a memory device according to the present invention and using a photomask set comprising the photomasks illustrated in FIGS. 12D and 13 results in a memory device having a structure of landing pads illustrated in FIG. 3C.

The photomasks, illustrated in FIGS. 12 and 13 may include non-printing assist features. Assist features like serifs or scattering bars can be arranged at the edges or boundaries of the structures in the first or second photomask. These assist features improve the lithographic imaging of the structures. Also other assist features which will be printed by the lithographic processes can be used outside the regions comprising the line structures or landing pads to further improve the imaging of structures.

Figure 14:
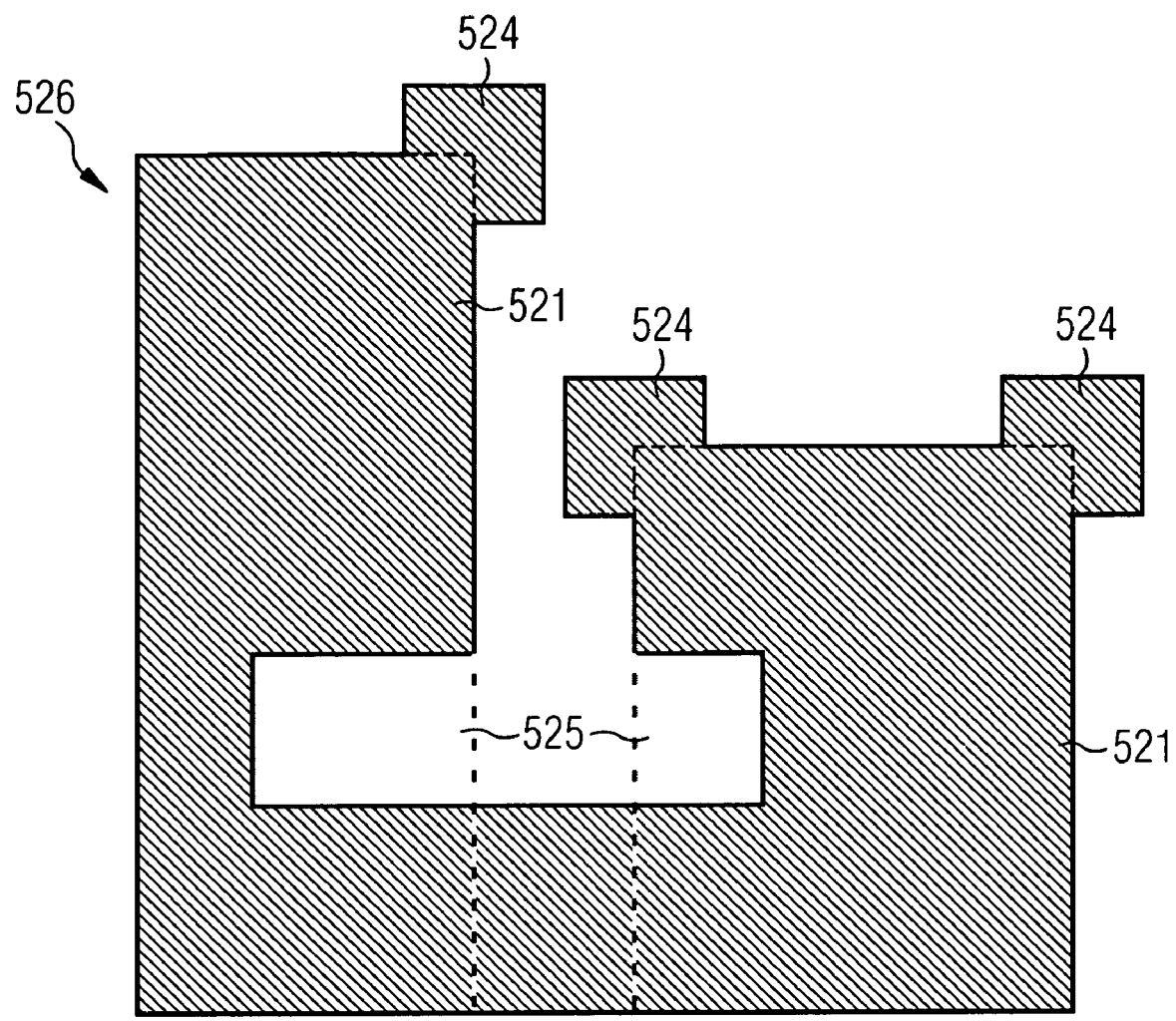
FIG. 14 illustrates a plan view on assist structures in the second photomask according to the detail of FIG. 11.

FIG. 14 illustrates the detail 526 of FIG. 11. Nevertheless, the described structures can be applied to any structure in any photomask which may benefit from using those structures while being imaged. In particular, FIG. 14 illustrates assist features 524 applied to fingers 521. Non-printing opaque serifs are used as assist features to improve the imaging of the edges of fingers 521. The transparent portions 525 adjacent to the fingers 521 improve the imaging of the space between two neighbouring fingers. The dashed line describes the boundary of the finger 521 patterned in the photoresist. These assist features and transparent portions can be applied to every space and finger. Nevertheless, other assist features like scattering bars or others, printing or non-printing, can be used in any photomask described here as it is well known to persons skilled in the art.

The embodiments of the invention described in the foregoing are examples given by way of illustration and the invention is nowise limited thereto. Any modification, variation and equivalent arrangement should be considered as being included within the scope of the invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of patterning a layer to be patterned, comprising:
    providing a layer to be patterned;
    providing a hard mask layer stack, comprising a carbon layer disposed on top of the layer to be patterned, a first layer of a material selected from a group comprising of $SiO_2$ and SiON disposed on top of the carbon layer, and a silicon layer disposed on top of the first layer, on the layer to be patterned;
    providing, a first photoresist layer on top of the silicon layer;
    imaging first structures in a first exposure using a first photomask into the first photoresist layer; and
    developing the first photoresist layer, so as to generate a photoresist pattern on the silicon layer;
    etching the portions of the silicon layer uncovered by the fist photoresist pattern thereby forming first patterns;
    removing the first photoresist layer from the silicon layer leaving a surface of a substrate with regions covered by the silicon layer and regions with uncovered first layer of the hard mask layer stack;
    providing a second photoresist layer on top of the surface of the substrate;
    imaging second structures in a second exposure using a second photomask into the second photoresist layer;
    developing the second photoresist, so as to generate a photoresist pattern on the surface of the substrate; and
    etching the uncovered portions of the silicon layer uncovered by the second photoresist pattern thereby forming second patterns;
    patterning the first layer and the carbon layer in accordance with the second patterns; and
    etching the uncovered portions of the layer to be patterned.

2. The method of claim 1, wherein the first structures comprise conductive lines and the second structures comprise landing pads connected with the conductive lines of a semiconductor device.

3. A method of patterning comprising:
    providing a hard mask layer stack on a layer to be patterned;
    wherein the hard mask layer stack comprises a carbon layer, a first layer of a material selected from a group comprising of $SiO_2$ and SiON, and a silicon layer;
    providing a first photoresist layer on top of the silicon layer;
    imaging first structures in a first exposure using a first photomask into the first photoresist layer;
    developing the first photoresist layer, so as to generate a first photoresist pattern on the silicon layer;
    etching the portions of the silicon layer uncovered by the first photoresist pattern thereby forming first patterns;
    removing the first photoresist layer from the silicon layer leaving a surface of a substrate with regions covered by the silicon layer and regions with uncovered first layer of the hard mask layer stack;
    providing a second photoresist layer on top of the surface of the substrate;
    imaging second structures in a second exposure using a second photomask into the second photoresist layer:
    developing the second photoresist, so as to generate a second photoresist pattern on the surface of the substrate;
    etching the portions of the silicon layer uncovered by the second photoresist pattern thereby forming second patterns;
    patterning the first layer and the carbon layer in accordance with the second patterns; and
    etching the uncovered portions of the layer to be patterned.

4. The method of claim 3, wherein the first structures comprise conductive lines and the second structures comprise landing pads connected with the conductive lines of a semiconductor device.

* * * * *